(12) United States Patent
Hayashi et al.

(10) Patent No.: US 7,714,357 B2
(45) Date of Patent: May 11, 2010

(54) SEMICONDUCTOR DEVICE

(75) Inventors: Takahiro Hayashi, Tokyo (JP);
Shunsuke Toyoshima, Tokyo (JP);
Kazuo Sakamoto, Tokyo (JP); Naozumi Morino, Tokyo (JP); Kazuo Tanaka, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 4 days.

(21) Appl. No.: 12/253,850

(22) Filed: Oct. 17, 2008

(65) Prior Publication Data

US 2009/0050940 A1 Feb. 26, 2009

Related U.S. Application Data

(63) Continuation of application No. 11/604,855, filed on Nov. 28, 2006, now abandoned.

(30) Foreign Application Priority Data

Nov. 30, 2005 (JP) .............................. 2005-345347

(51) Int. Cl.
*H01L 29/74* (2006.01)
*H01L 23/52* (2006.01)
(52) U.S. Cl. ...................... 257/173; 257/758; 257/786; 257/E23.02
(58) Field of Classification Search ................. 257/173, 257/203, 758, 786, E23.02
See application file for complete search history.

(56) References Cited

U.S. PATENT DOCUMENTS

| 5,892,276 | A | 4/1999 | Miki et al. |
| 6,858,885 | B2 * | 2/2005 | Ebara .......................... 257/173 |
| 2001/0053054 | A1 | 12/2001 | Andoh |
| 2006/0157856 | A1 | 7/2006 | Ichikawa et al. |

FOREIGN PATENT DOCUMENTS

| JP | 9-283632 A | 10/1997 |
| JP | 2003-163267 A | 6/2003 |

\* cited by examiner

*Primary Examiner*—Sue Purvis
*Assistant Examiner*—Selim Ahmed
(74) *Attorney, Agent, or Firm*—Miles & Stockbridge P.C.

(57) ABSTRACT

The present invention has for its purpose to provide a technique capable of reducing planar dimension of the semiconductor device. An input/output circuit is formed over the semiconductor substrate, a grounding wiring and a power supply wiring pass over the input/output circuit, and a conductive layer for a bonding pad is formed thereover. The input/output circuit is formed of MISFET elements in the nMISFET forming region and the pMISFET forming region, resistance elements in the resistance element forming regions and diode elements in the diode element forming regions functioning as protective elements. A wiring connected to the protective elements and positioned under the grounding wiring and the power supply wiring is pulled out in a pulling-out region between the nMISFET forming region and the pMISFET forming region and between the grounding wiring and the power supply wiring to be connected to the conductive layer.

15 Claims, 23 Drawing Sheets

SEMICONDUCTOR DEVICE

CROSS-REFERENCE TO RELATED APPLICATION

This application is a continuation of application Ser. No. 11/604,855 filed Nov. 28, 2006 now abandoned. The present application also claims priority from Japanese patent application No. 2005-345347 filed on Nov. 30, 2005 the content of which is hereby incorporated by reference into this application.

BACKGROUND OF THE INVENTION

The present invention relates to a semiconductor device, and in particular, to an effective technique applicable to a semiconductor device with bonding pads.

Various semiconductor integrated circuits are formed on a semiconductor wafer made of, for example, a single crystal silicon and others and then the semiconductor device wafer is separated into semiconductor chips by dicing to manufacture chip-shaped semiconductor devices. On the main surface of the semiconductor device a plurality of bonding pads acting as an external terminal are provided along the periphery of the semiconductor device.

Japanese Unexamined Patent Publication No. Hei09 (1997)-283632 (Patent Document 1) sets forth a technique in which, in the semiconductor device with three or more wiring layers on which a plurality of rows of bonding pads are staggered along the periphery of a semiconductor chip, a first lead wiring electrically connecting the bonding pad in the inner row to an inner circuit is formed by one or more wiring layers including at least the wiring of the uppermost layer and a second lead wiring electrically connecting the bonding pad in the outer row to the inner circuit is formed by a plurality of wirings different from the first lead wiring.

Japanese Unexamined Patent Publication No. 2003-163267 (Patent Document 2) discloses a technique in which, in a semiconductor device provided with a cell section and a buffer circuit formed to surround the cell section, a plurality of bonding pads are formed over the periphery of the buffer circuit and over the buffer circuit and staggered over the periphery of the buffer circuit and over the buffer circuit.

(Patent Document 1) Japanese Unexamined Patent Publication No. Hei09(1997)-283632
(Patent Document 2) Japanese Unexamined Patent Publication No. 2003-163267

SUMMARY OF THE INVENTION

The inventors' investigation has revealed the following.

There has been demand for downsizing a semiconductor device and increasing terminals thereof in recent years. Staggering bonding pads shortens an effective pitch of the bonding pad, which enables more bonding pads to be formed for a semiconductor device of the same size and the terminal thereof to be increased in number.

An input/output circuit is provided on each bonding pad and a power supply wiring is formed along the periphery of the semiconductor device. The input/output circuit is constructed of various elements formed on a semiconductor substrate constituting the semiconductor device. The input/output circuit is connected to the bonding pad and the power supply wiring according to need. Since the bonding pad is formed by the uppermost metallic layer, a wiring to be connected to elements constituting the input/output circuit needs drawing up to be connected to the metallic layer for the bonding pads. If the drawing-up portion is provided in the end of the input/output circuit forming region and the bonding pad is arranged further outside than the drawing-up portion, the planar dimension of the semiconductor device requires to be increased by the bonding pad. In particular, if the bonding pads are staggered, the bonding pads on the side of the inner periphery can be arranged further inside than the aforementioned drawing-up portion, however, the bonding pads on the side of the outer periphery needs to be arranged further outside than the drawing-up portion, so that the planar dimension of the semiconductor device requires to be increased by the bonding pad on the side of the outer periphery. This becomes disadvantageous for downsizing the semiconductor device.

When the power supply wiring and the bonding pad are formed by the metallic layer of the same layer, if the power supply wiring is arranged through a detour around the input/output circuit, the power supply wiring is reduced in width, which decreases current density. If the power supply wiring is increased in width to maintain the current density, which increases planar dimension. This also becomes disadvantageous for downsizing the semiconductor device.

The present invention has for its purpose to provide a technique capable of reducing dimension, or planar dimension, of the semiconductor device.

The above and other objects and novel features of the present invention will become more apparent from the description of the specification and the accompanying drawings.

The following is a brief description of outlines of typical ones out of the inventions disclosed in the present specification.

In the present invention, a first and a second power supply wiring pass over protective elements formed on the semiconductor substrate and electrically connected to bonding pads, a first wiring positioned under the first and the second power supply wiring and electrically connected to the protective elements is pulled out over the first and the second power supply wiring in the pulled-out region between the first and the second power supply wiring to be electrically connected to a first conductive layer for the bonding pads positioned over the first and the second power supply wiring.

In the present invention, the protective elements formed over the semiconductor substrate and electrically connected to the bonding pads include MISFET elements. The MISFET elements are formed in a first and a second MISFET forming region. The first wiring positioned under the power supply wirings and electrically connected to the protective element is pulled out over the power supply wirings in the pulling-out region between the first and the second MISFET forming region to be electrically connected to the first conductive layer for the bonding pads.

The following is a brief description of effects obtained from typical ones out of the inventions disclosed in the present specification.

The dimension (planar dimension) of a semiconductor device can be reduced.

DETAILED DESCRIPTION OF THE PREFERRED EMBODIMENTS

Figure 1:
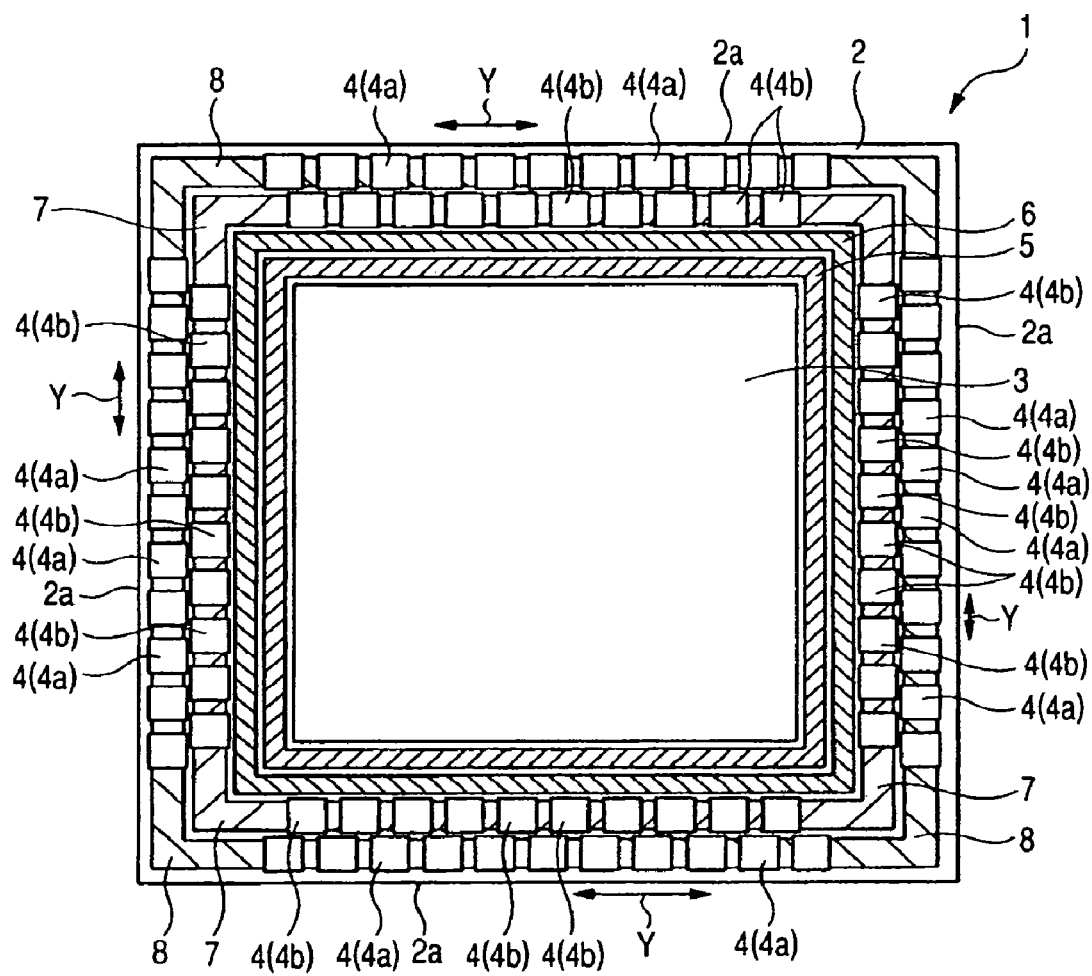
FIG. 1 is a top view showing a semiconductor device according to one embodiment of the present invention.

In the following embodiments, descriptions are divided into plural sections or embodiments as a matter of convenience as required. However, the descriptions are related to each other except where an explicit statement is made to some other effect, and a description below is a modification, provides further details, or supplements part or all of some other description. When numbers of elements and so on (including numbers, values, amounts, and ranges) are referred to in the following embodiments, the number need not be the stated number, unless an explicit statement is made to this effect and the number is clearly, in principle, limited to specific numbers. The number may be higher or lower than the stated number. Furthermore, in the following embodiments, it is needless to say that constituent elements (including element steps) are not always required unless an explicit statement is made to this effect and the element is clearly, in principle, considered as essential. Similarly, when the shape of a constituent element, positional relationship and others are referred to in the following embodiments, ones being substantially similar or analogous to the shape and others should be included unless an explicit statement is made to this effect and the ones are not clearly, in principle, considered so. This holds true for the values and ranges.

The embodiments of the present invention are described in detail below with reference to the drawings. In the all figures for describing the embodiments, the members with the same functions are given the same reference numerals and characters to omit the duplicated description thereof.

In the drawings used in the embodiments, hatching is sometimes omitted from a cross section to make it easily viewable. On the other hand, hatching lines are sometimes drawn in a top view or perspective view to make views easily viewable.

First Embodiment

FIG. 1 is a top view (entire top view) showing a semiconductor device 1 according to one embodiment of the present invention. FIG. 1 is a top view, however, hatching is drawn in a power supply wiring 5, a grounding wiring 6, a grounding wiring 7 and a power supply wiring 8 to make them easily viewable.

The semiconductor device (semiconductor chip) 1 is formed in such a manner that various semiconductor integrated circuits and bonding pads 4 are formed on a semiconductor substrate (semiconductor wafer) made of, for example, a single crystal silicon and others and then the semiconductor substrate is separated into each chip-shaped semiconductor device (semiconductor chip) 1 by dicing. For this reason, the semiconductor device 1 is a semiconductor chip.

A core region (cell section and internal circuit forming region) 3 is arranged in the central portion of a main surface 2 of the semiconductor device 1. Various semiconductor integrated circuits (internal circuits) are formed in the core region 3. The core region 3 is configured by arranging a large number of basic cells constituted by combining a prescribed number of, for example, an n-channel MISFET and a p-channel MISFET in a matrix form. Connecting the MISFETs in the basic cells and the basic cells to each other based on a logic design realizes a desired logic function.

A plurality of bonding pads (pad electrodes, external terminals and external connecting terminals) 4 are arranged along the peripheral on the main surface 2 of the semiconductor device 1. The bonding pads 4 are capable of functioning as external terminals (external connecting terminals and input/output circuit terminals) of the semiconductor device 1 to establish an electrical connection to external devices.

The power supply wiring 5 and the grounding wiring 6 for the core region 3 are arranged outside the core region 3 on the main surface 2 of the semiconductor device 1. The grounding wiring 7 and the power supply wiring 8 for an input/output (I/O) are arranged further outside thereof. The power supply wiring 5, the grounding wiring 6, the grounding wiring 7 and the power supply wiring 8 extend along the periphery of the main surface 2 of the semiconductor device 1, (that is to say, in the Y direction described later) and are arranged outside the core region 3 (on the side of the periphery of the main surface 2 of the semiconductor device 1, that is, on the side of an end 2a). The power supply wiring 5 and the grounding wiring 6 for the core region 3 are arranged inside the grounding wiring 7 and the power supply wiring 8 for input/output (on the inner side of main surface 2 of the semiconductor device 1). For example, the power supply wiring 5, the grounding wiring 6, the grounding wiring 7 and the power supply wiring 8 are arranged in this order from inside to outside.

The power supply wiring 5 for the core region 3 is a wiring for supplying a power-supply electric potential (fixed electric potential and reference electric potential) to circuits and elements of the core region 3. The grounding wiring 6 for the core region 3 is a wiring for supplying a grounding electric potential to circuits and elements of the core region 3. The grounding wiring 7 is a wiring for supplying a grounding electric potential to an input/output circuit 11 described later. The power supply wiring 8 is a wiring for supplying a power-supply electric potential (fixed electric potential and reference electric potential) to the input/output circuit 11. Turning on the power supply of the semiconductor device 1 applies a constant voltage across the power supply wiring 5, the grounding wiring 6, the grounding wiring 7 and the power supply wiring 8. For example, turning on the power supply of the semiconductor device 1 applies a grounding electric potential across the grounding wirings 6 and 7 and applies a power-supply electric potential (fixed electric potential and reference electric potential) different from each other across the power supply wirings 5 and 8.

It is more preferable to supply a grounding electric potential across the grounding wirings 6 and 7, but it is also possible to supply a non-grounding electric potential, or a power-supply electric potential (fixed electric potential and reference electric potential). At this point, at least a power-supply electric potential different from one to be applied across the power supply wiring 5 is applied across the grounding wiring 6, and a power-supply electric potential different from one to be applied across the power supply wiring 8 is applied across the grounding wiring 7. Therefore, not only the power supply wirings 5 and 8 but the grounding wirings 6 and 7 may be regarded as power supply wirings. For example, one of the grounding wiring 7 and the power supply wiring 8 may be regarded as a first power supply wiring (power supply wiring at a first electric potential) and the other may be regarded as a second power supply wiring (power supply wiring at a second electric potential different from the first electric potential). In addition, one of the power supply wiring 5 and the grounding wiring 6 may be regarded as a third power supply wiring (power supply wiring at a third electric potential) and the other may be regarded as a fourth power supply wiring (power supply wiring at a fourth electric potential different from the third electric potential).

A plurality of the bonding pads 4 provided on the main surface 2 of the semiconductor device 1 are arranged in two rows along each side of the semiconductor device 1. The position of the bonding pads 4 is displaced by half pitch between the rows, in other words, the bonding pads 4 are staggered. For instance, a plurality of the bonding pads 4 are arranged in two rows along each side of the semiconductor device 1 and the position of the bonding pads 4 is displaced by half pitch between the rows. A first bonding pad 4a near the end 2a of the semiconductor device 1 and a second bonding pad 4b positioned further inside the semiconductor device 1 than the first bonding pad 4a are alternately arranged. Staggering the bonding pads 4 shortens an effective pitch of the bonding pad 4, allowing more bonding pads to be formed on a semiconductor device of the same size, which enables the terminal of the semiconductor device to be increased in number.

Figure 2:
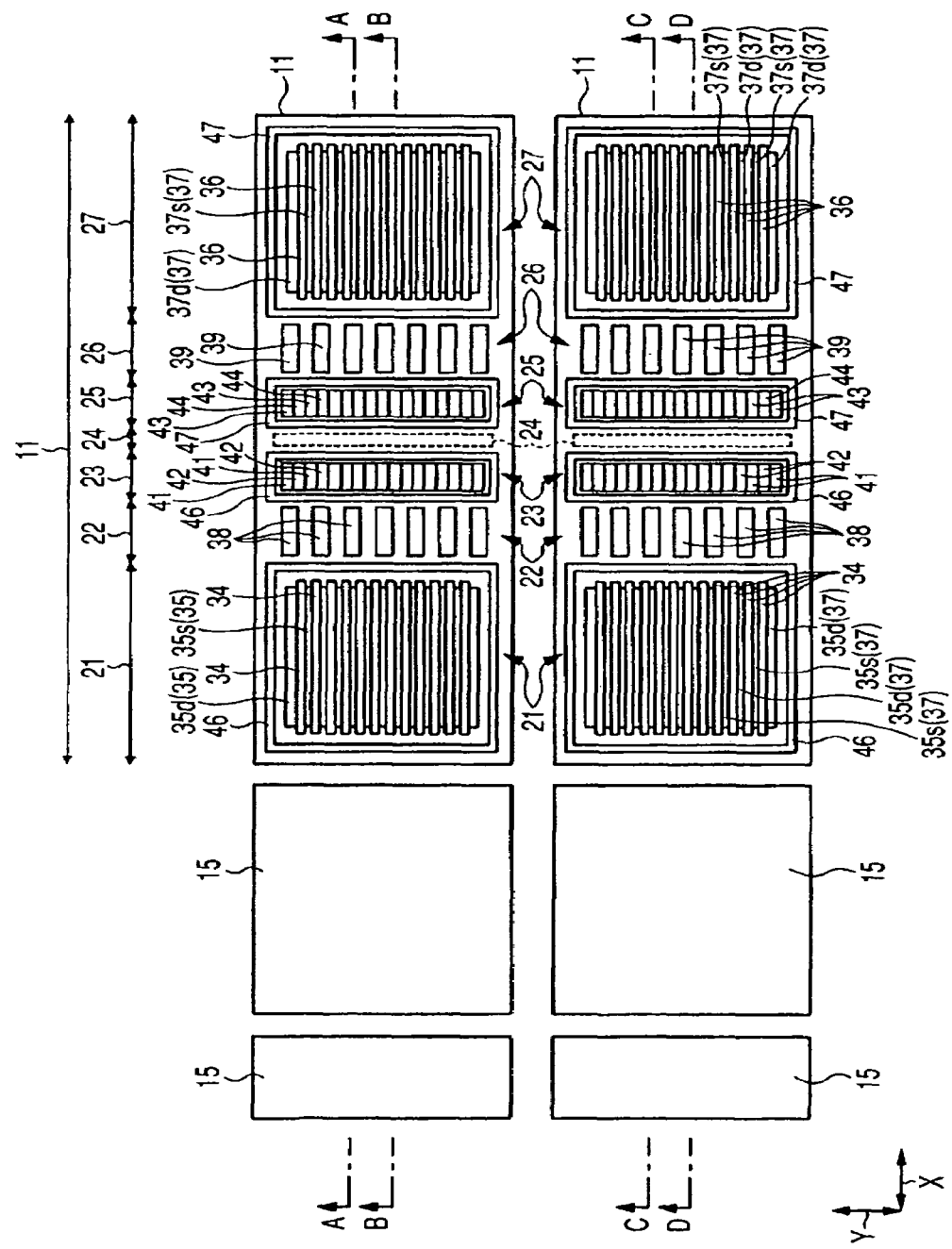
FIG. 2 is a top view showing the principal elements of the semiconductor device according to one embodiment of the present invention.
Figure 3:
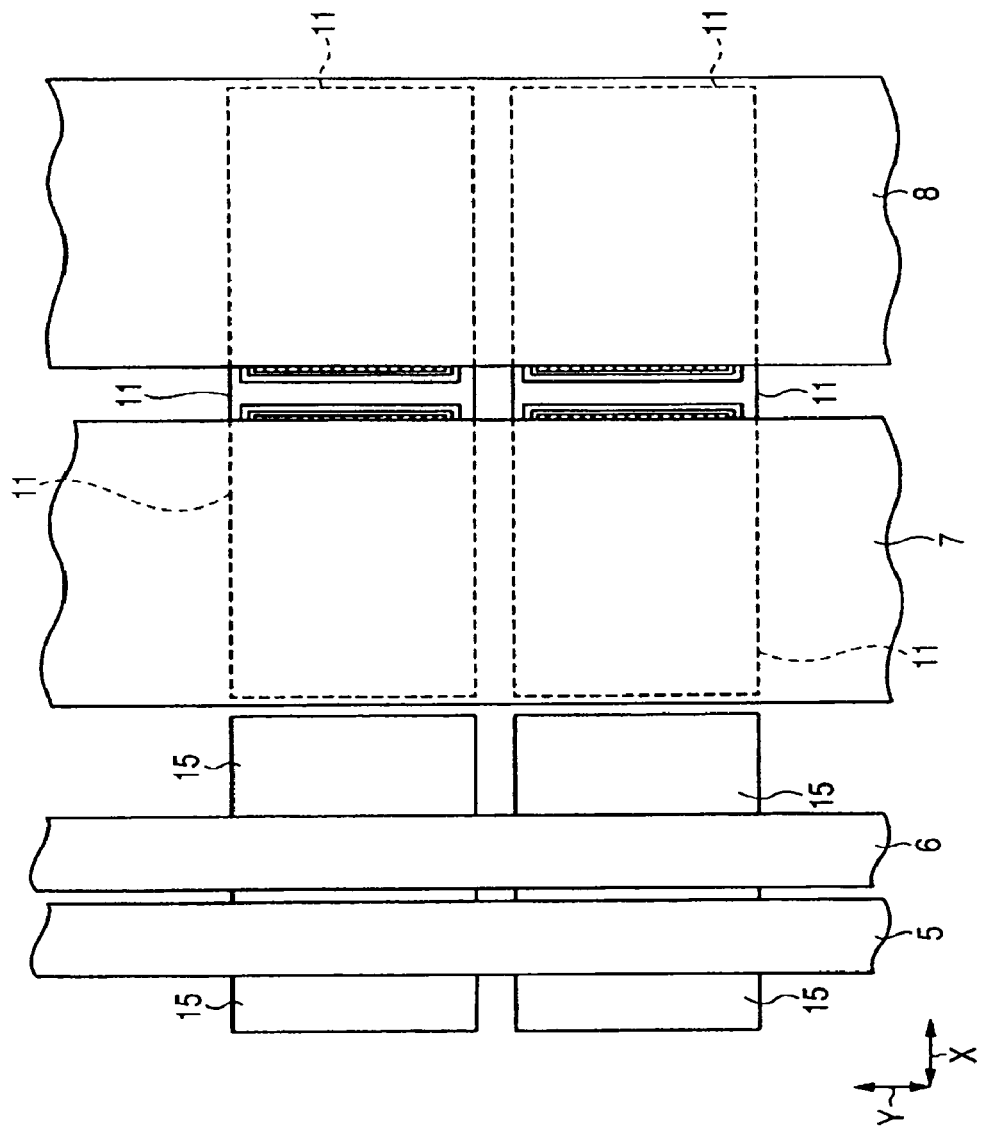
FIG. 3 is a top view showing the principal elements of the semiconductor device according to one embodiment of the present invention.
Figure 4:
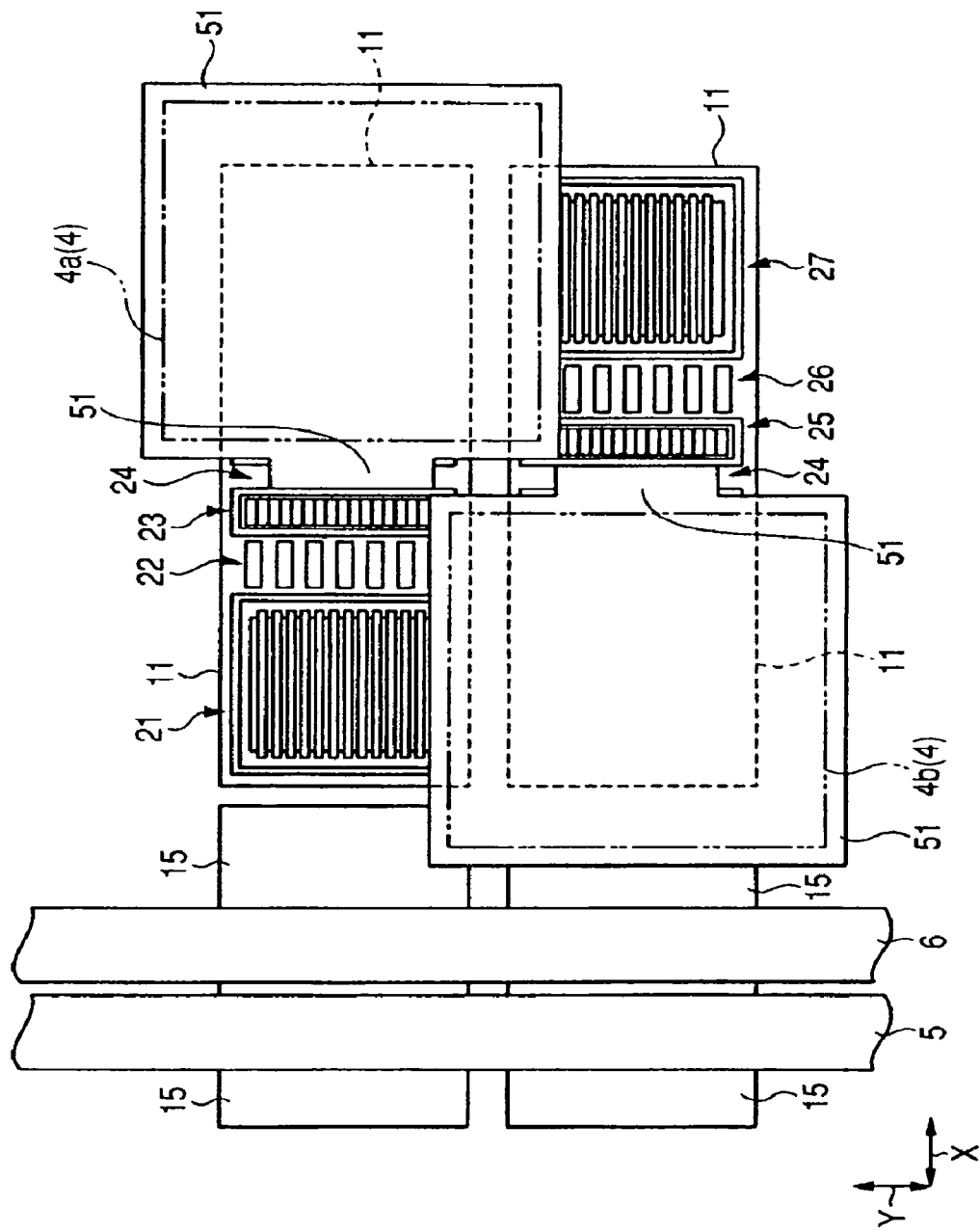
FIG. 4 is a top view showing the principal elements of the semiconductor device according to one embodiment of the present invention.
Figure 5:
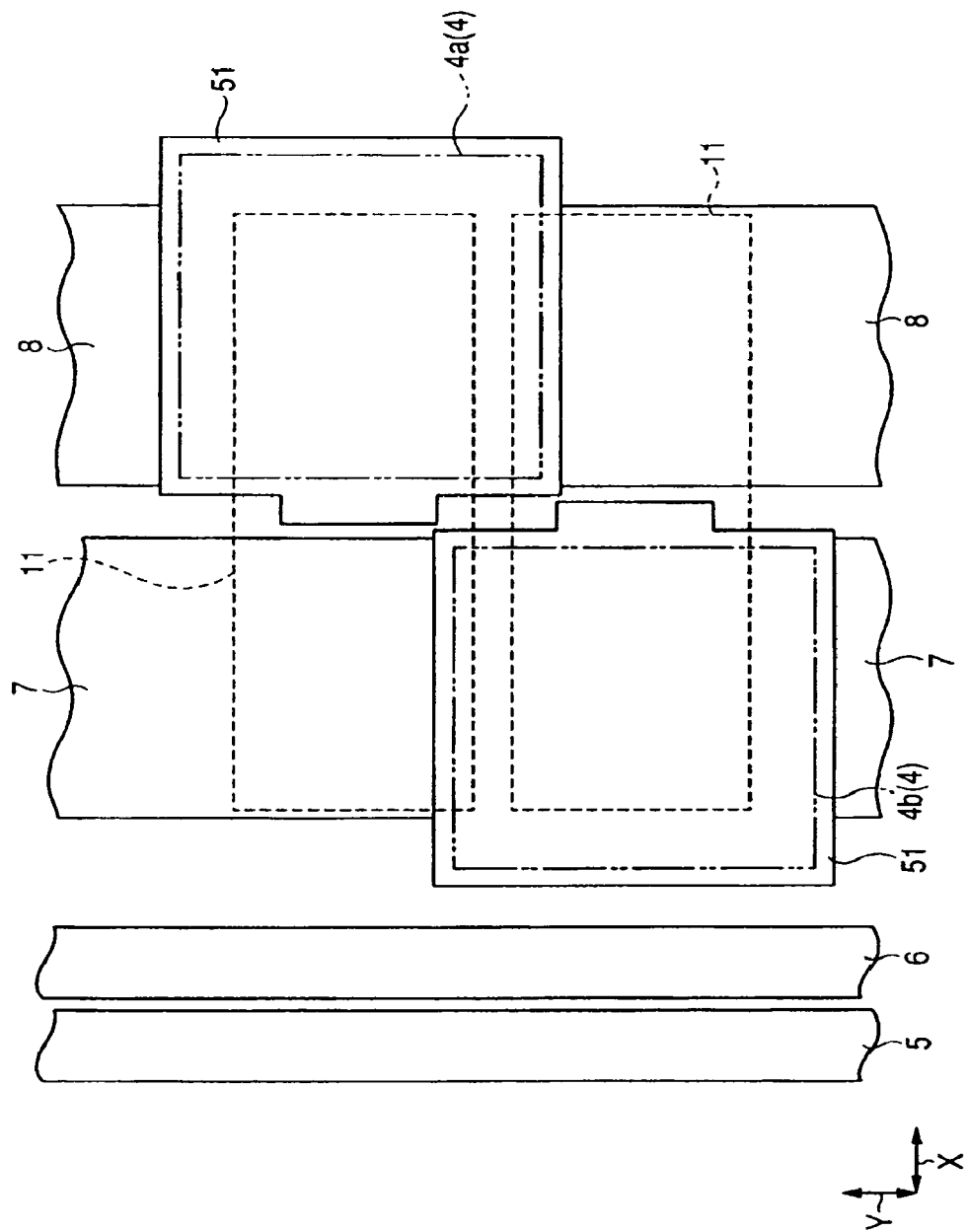
FIG. 5 is a top view showing the principal elements of the semiconductor device according to one embodiment of the present invention.
Figure 9:
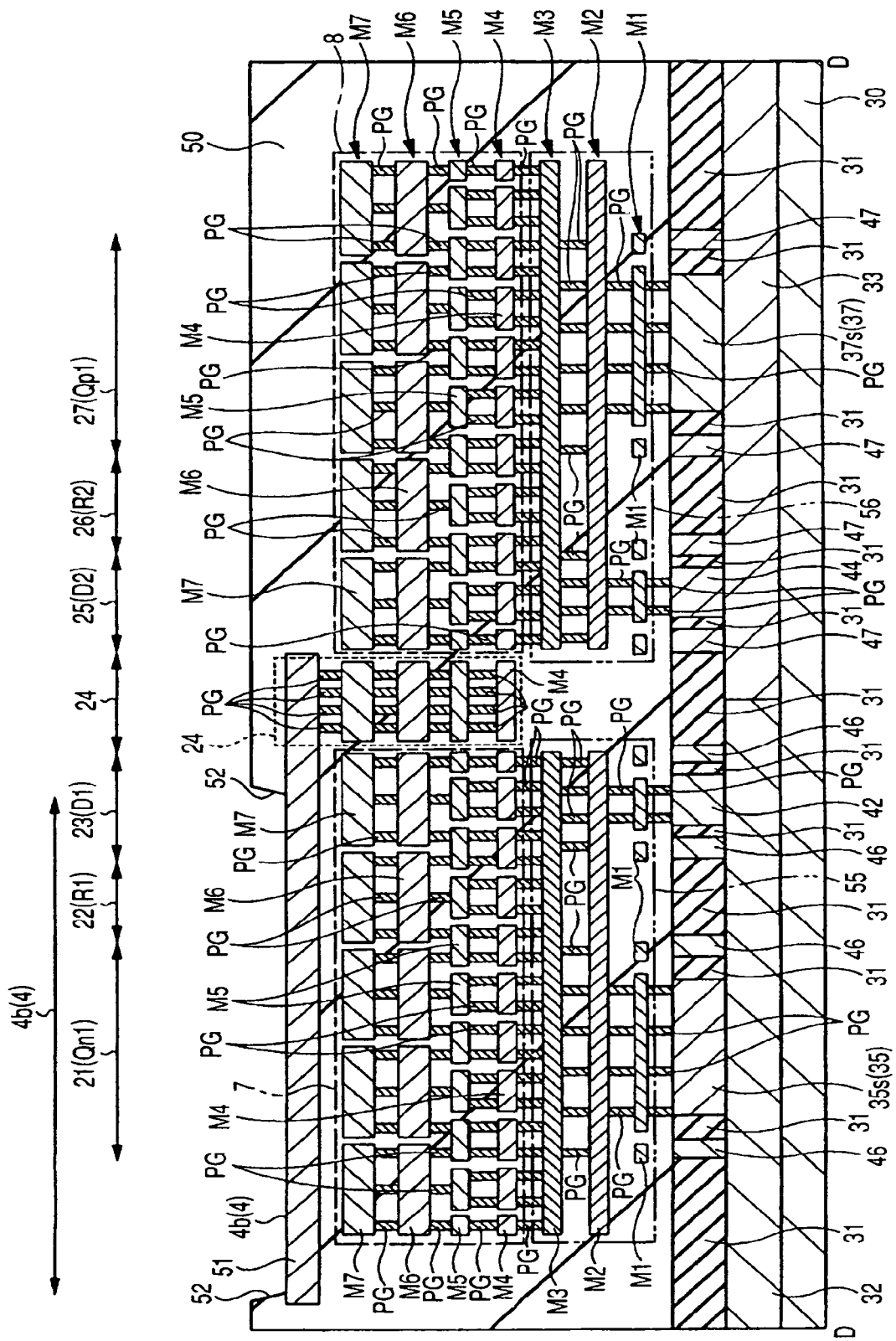
FIG. 9 is a cross section showing the principal elements of the semiconductor device according to one embodiment of the present invention.
Figure 10:
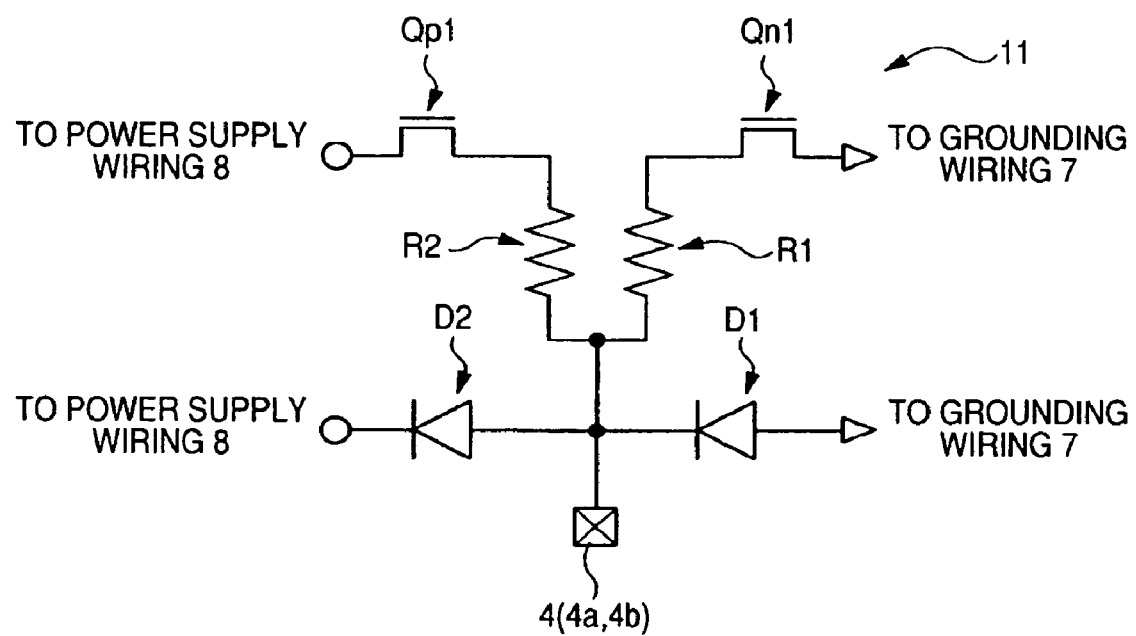
FIG. 10 is a circuit diagram showing an input/output circuit of the semiconductor device according to one embodiment of the present invention.

FIGS. 2 to 5 are top views showing the principal elements of the semiconductor device 1 according to the present embodiment and illustrate the periphery of the semiconductor device 1. FIGS. 6 to 9 are cross sections showing the principal elements of the semiconductor device 1 according to the present embodiment. FIG. 10 is a circuit diagram (equivalent circuit diagram) showing the input/output circuit 11 of the semiconductor device 1 according to the present embodiment. FIGS. 2 to 5 show the same region. FIG. 2 shows a planar layout of the input/output circuit 11 and a circuit 15. FIG. 3 corresponds to a figure in which the power supply wiring 5, the grounding wiring 6, the grounding wiring 7 and the power supply wiring 8 are added to FIG. 2. FIG. 4 corresponds to a figure in which the power supply wiring 5, the grounding wiring 6, a conductive layer 51 and the bonding pad 4 are added to FIG. 2. FIG. 5 shows a planar layout of the input/output circuit 11, the power supply wiring 5, the grounding wiring 6, the grounding wiring 7, the power supply wiring 8, the conductive layer 51 and the bonding pad 4. A cross section along line A-A in FIG. 2 corresponds to FIG. 6. A cross section along line B-B in FIG. 2 corresponds to FIG. 7. A cross section along line C-C in FIG. 2 corresponds to FIG. 8. A cross section along line D-D in FIG. 2 corresponds to FIG. 9.

A plurality of the input/output circuits 11 (input/output circuit sections, input/output buffer circuits, buffer circuits, I/O circuits and I/O buffer circuits) are arranged along the periphery of the main surface 2 of the semiconductor device 1. The bonding pads 4 corresponding to the input/output circuits 11 are arranged in the vicinity thereof and electrically connected to the input/output circuits 11 respectively. A plurality of the bonding pads 4 and of the input/output circuits 11 are so arranged as to surround the core region 3 therearound.

As can be seen from the circuit diagram in FIG. 10, the input/output circuit 11 includes the n-channel MISFET Qn1 (hereinafter referred to as "nMISFET Qn1") for output (for output control and input/output control), the p-channel MISFET Qp1 (hereinafter referred to as "pMISFET Qp1") for output (for output control and input/output control) and resistance elements R1 and R2 for protection and diode elements D1 and D2 for protection. The bonding pads 4 are electrically connected to the grounding wiring 7 and the power supply wiring 8 through the input/output circuit 11.

The bonding pads 4 are electrically connected to the input/output circuit 11 and electrically connected to the grounding wiring 7 and the power supply wiring 8 through the input/output circuit 11. Specifically, the bonding pads 4 are electrically connected to one of the source or the drain (the drain in this case) of the nMISFET Qn1 through the resistance element R1 and electrically connected to one of the source or the drain (the drain in this case) of the pMISFET Qp1 through the resistance element R2. The other of the source or the drain (the source in this case) of the nMISFET Qn1 is electrically connected to the grounding wiring 7 for input/output and the other of the source or the drain (the source in this case) of the pMISFET Qp1 is electrically connected to the power supply wiring 8 input/output. The gate electrodes of the nMISFET Qn1 and the pMISFET Qp1 are electrically connected to the circuit 15, or circuits or elements in the core region 3. The bonding pads 4 are electrically connected to the grounding wiring 7 via a diode D1 and are electrically connected to the power supply wiring 8 via the diode D2.

The diodes D1 and D2 and the resistance elements R1 and R2 among the elements constituting the input/output circuit 11 are capable of functioning as elements for protection (protective element). For example, when a surge (ESD surge) is inputted into the bonding pads 4, the resistance elements R2 and R2 prevent the surge from being inputted into the nMISFET Qn1 and the pMISFET Qp1 to pass it to the grounding wiring 7 or the power supply wiring 8 through the diodes D1 or D2. In other words, the diodes D1 and D2 and the resistance elements R1 and R2 prevent the surge (ESD surge) from being inputted into the nMISFET Qn1 and the pMISFET Qp1, which permits the nMISFET Qn1 and the pMISFET Qp1 to be protected. Thus, the protective elements (the diodes D1 and D2 and the resistance elements R1 and R2) are electrically connected to the bonding pads 4. These protective elements are formed on the semiconductor substrate 30 as discussed later.

The nMISFET Qn1 and the pMISFET Qp1 among the elements constituting the input/output circuit 11 are capable of functioning as elements for output control (for input/output control). For instance, turning on and off nMISFET Qn1 and/or turning on and off the pMISFET Qp1 allow the output (input/output) of the bonding pads 4 to be controlled.

It is preferable that a connection relationship between the nMISFET Qn1 and the pMISFET Qp1 shown in FIG. 10 is applied when the input/output circuit 11 acts as an output circuit and the bonding pad 4 acts as a bonding pad for outputting signals. When the input/output circuit 11 acts as an input circuit and the bonding pad 4 acts as a bonding pad for inputting signals, a connection relationship between the nMISFET Qn1 and the pMISFET Qp1 can be changed from one in FIG. 10. For example, the bonding pad 4 can be electrically connected to the gate of the nMISFET Qn1 through the resistance element R1 or to the gate of the pMISFET Qp1 through the resistance element R2. In this case, one of the source or the drain of the nMISFET Qn1 may be electrically connected to the grounding wiring 7, one of the source or the drain of the pMISFET Qp1 may be electrically connected to the power supply wiring 8, the other of the source or the drain of the nMISFET Qn1 and the other of the source or the drain of the p-channel MISFET Qp1 may be electrically connected to the circuit 15, or the circuits or elements of the core region 3. Thus, even if a connection relationship between the nMISFET Qn1 and the pMISFET Qp1 is changed, the present embodiment is applicable. For this reason, it is preferable that the present embodiment is applied when the bonding pad 4 is used for input/output or for inputting/outputting signals.

As shown in FIGS. 2 to 9, the nMISFET forming region 21, the resistance element forming region 22, the diode element forming region 23, the pulling-out region 24, the diode element forming region 25, the resistance element forming region 26 and the pMISFET forming region 27 are arranged on the periphery of the main surface 2 of the semiconductor device 1 in this order in the direction from the inside (the inner side of the main surface 2 of the semiconductor device 1) to the periphery (the side of end 2a of the main surface 2 of the semiconductor device 1), i.e., in the X-direction in FIGS. 2 to 6. A Y-direction in FIGS. 2 to 6 is a (parallel) direction along four sides (ends 2a) of the main surface 2 of the semiconductor device 1 and the X-direction is a direction orthogonal (intersects) to the Y-direction. Along the X-direction (in parallel), the nMISFET forming region 21, the resistance element forming region 22, the diode element forming region 23, the pulling-out region 24, the diode element forming region 25, the resistance element forming region 26 and the pMISFET forming region 27 are arranged in this order. Since the grounding wiring 7 and the power supply wiring 8 extend to the Y-direction, the nMISFET forming region 21, the resistance element forming region 22, the diode element forming region 23, the pulling-out region 24, the diode element forming region 25, the resistance element forming region 26 and the pMISFET forming region 27 are arranged in this order in the direction (X-direction) intersecting (preferably orthogonal) with the direction (Y-direction) to which the grounding wiring 7 and the power supply wiring 8 extend.

The nMISFET forming region 21 is a region where a Metal Insulator Semiconductor Field Effect Transistor (MISFET) corresponding to the nMISFET Qn1 is formed. The resistance element forming region 22 is a region where a resistance element corresponding to the resistance element R1 is formed. The diode element forming region 23 is a region where a diode element corresponding to the diode D1 is formed. The diode element forming region 25 is a region where a diode element corresponding to the diode D2 is formed. The resistance element forming region 26 is a region where a resistance element corresponding to the resistance element R2 is formed. The pMISFET forming region 27 is a region where a MISFET corresponding to the pMISFET Qp1 is formed. Thus, the input/output circuit 11 is formed by the nMISFET forming region 21 (nMISFET Qn1), the resistance element forming region 22 (resistance element R1), the diode element forming region 23 (diode D1), the diode element forming region 25 (diode D2), the resistance element forming region 26 (resistance element R2) and the pMISFET forming region 27 (pMISFET Qp1). The input/output circuit 11 is provided on each bonding pad 4.

The circuit 15 is a circuit region where, for example, a level shifter, an input/output (I/O) control logic section and others are formed and is provided further inside the input/output circuit 11 on the main surface 2 of the semiconductor device 1. The power supply wiring 5 and the grounding wiring 6 run over the circuit 15.

The configuration of periphery of the semiconductor device 1 is described in further detail with reference to FIGS. 2 to 9.

The nMISFET forming region 21, the resistance element forming region 22, the diode element forming region 23, the diode element forming region 25, the resistance element forming region 26 and the pMISFET forming region 27 are arranged over the main surface of the semiconductor substrate (semiconductor wafer) 30 primarily constructed of, for example, p-type single crystal silicon. The regions are electrically separated from one another by element isolating regions 31 formed over the main surface of the semiconductor substrate 30. The element isolating region 31 includes an insulating material such as silicon oxide and others (field insulating film or embedded insulating film) and may be formed by Shallow Trench Isolation (STI) method or Local Oxidation of Silicon (LOCOS) method.

A p-type well (p-type semiconductor region) 32 and an n-type well (n-type semiconductor region) 33 are formed on the main surface of the semiconductor substrate 30. The p-type well 32 is formed in the region two-dimensionally including the nMISFET forming region 21, the resistance element forming region 22 and the diode element forming region 23. The n-type well 33 is formed in the region two-dimensionally including the diode element forming region 25, the resistance element forming region 26 and the pMISFET forming region 27.

A plurality of gate electrodes 34 are formed over the p-type well 32 through a gate insulation film (not shown) so as to extend in the X-direction in the nMISFET forming region 21. The n-type semiconductor regions (n-type diffused layer) 35 as a source and a drain are formed in regions on both sides of the gate electrode 34. Among the n-type semiconductor regions 35, an n-type semiconductor region 35$d$ functions as one of a source or a drain (drain region in this case) and an n-type semiconductor region 35$s$ functions as one of a source or drain (source region in this case). A plurality of the gate electrodes 34 include, for instance, lower resistance polycrystalline silicon (doped polysilicon) film and are electrically connected to each other by wirings (not, shown). The n-channel MISFET constituting the nMISFET Qn1 is formed by the gate electrode 34, the gate insulation film (not shown) under the gate electrode 34 and the n-type semiconductor region 35 (35$d$ and 35$s$) as a source and a drain.

The pMISFET forming region 27 is almost the same in configuration as the nMISFET forming region 21 reversed in terms of conductivity type. That is to say, a plurality of gate electrodes 36 are formed over the n-type well 33 through a gate insulation film (not shown) so as to extend in the X-direction in the pMISFET forming region 27. The p-type semiconductor regions (p-type diffused layer) 37 as a source and a drain are formed in regions on both sides of the gate electrode 36. Among the p-type semiconductor regions 37, a p-type semiconductor region 37$d$ functions as one of a source or a drain (drain region in this case) and a p-type semiconductor region 37$s$ functions as one of a source or a drain (source region in this case). A plurality of the gate electrodes 36 include, for instance, lower resistance polycrystalline silicon (doped polysilicon) film and are electrically connected to each other by wirings (not shown). The p-channel MISFET constituting the pMISFET Qp1 is formed by the gate electrode 36, the gate insulation film (not shown) under the gate electrode 36 and the p-type semiconductor region 37 (37$d$ and 37$s$) as a source and a drain.

All over the resistance element forming region 22 is formed the element isolating region 31, on which a plurality of the resistance elements 38 (the resistance element 38 constituting the resistance element R1) including, for example, polycrystalline silicon (doped polysilicon) film into which impurities are introduced are formed.

The resistance element forming region 26 is substantially the same in configuration as the resistance element forming region 22. That is, all over the resistance element forming region 26 is formed the element isolating region 31, on which a plurality of the resistance elements 39 (the resistance element 39 constituting the resistance element R2) including, for example, polycrystalline silicon (doped polysilicon) film into which impurities are introduced are formed.

The resistance elements 38 and 39 may be formed in such a manner that a polycrystalline silicon film into which impurities are introduced is formed over the semiconductor substrate 30 and patterned by a photolithography method and a dry etching method. The resistance value of the resistance elements 38 and 39 is controlled within a desired value by adjusting the concentration of impurities introduced into the polycrystalline silicon film constituting the resistance elements 38 and 39, the dimensions of the polycrystalline silicon film constituting the resistance elements 38 and 39 and distance between the contacts (plugs PG) connected to the resistance elements 38 and 39.

In the diode element forming region 23, the n-type semiconductor region (n-type diffused layer) 41 and the p-type semiconductor region (p-type diffused layer) 42 are two-dimensionally formed adjacently to each other on the p-type well 32. For example, the n-type semiconductor region 41 and the p-type semiconductor region 42 extending in the X-direction are alternately arranged in the Y-direction. The diode element (the diode element constituting the diode element D1) is formed by a PN junction between the n-type semiconductor region 41 and the p-type semiconductor region 42. Incidentally, the p-type semiconductor region 42 may be constructed of a part of the p-type well 32.

The diode element forming region 25 is almost the same in configuration as the diode element forming region 23 reversed in terms of conductivity type. That is, in the diode element forming region 25, the p-type semiconductor region (p-type diffused layer) 43 and the n-type semiconductor region (n-type diffused layer) 44 are two-dimensionally formed adjacently to each other on the n-type well 33. The diode element (the diode element constituting the diode element D2) is formed by a PN junction between the p-type semiconductor region 43 and the n-type semiconductor region 44.

For example, the p-type semiconductor region 43 and the n-type semiconductor region 44 extending in the X-direction are alternately arranged in the Y-direction. Incidentally, the n-type semiconductor region 44 may be constructed of a part of the p-type well 33.

On the main surface 2 of the semiconductor substrate 30, p-type semiconductor regions (p-type diffused layer) 46 as a guard ring are formed around the nMISFET forming region 21 and the diode element forming region 23. In addition, on the main surface 2 of the semiconductor substrate 30, n-type semiconductor regions (n-type diffused layer) 47 as a guard ring are formed around the diode element forming region 25 and the pMISFET forming region 27. The p-type semiconductor region 46 may be constructed of a part of the p-type well 32. In addition, the n-type semiconductor region 47 may be constructed of a part of the n-type well 33.

Figure 6:
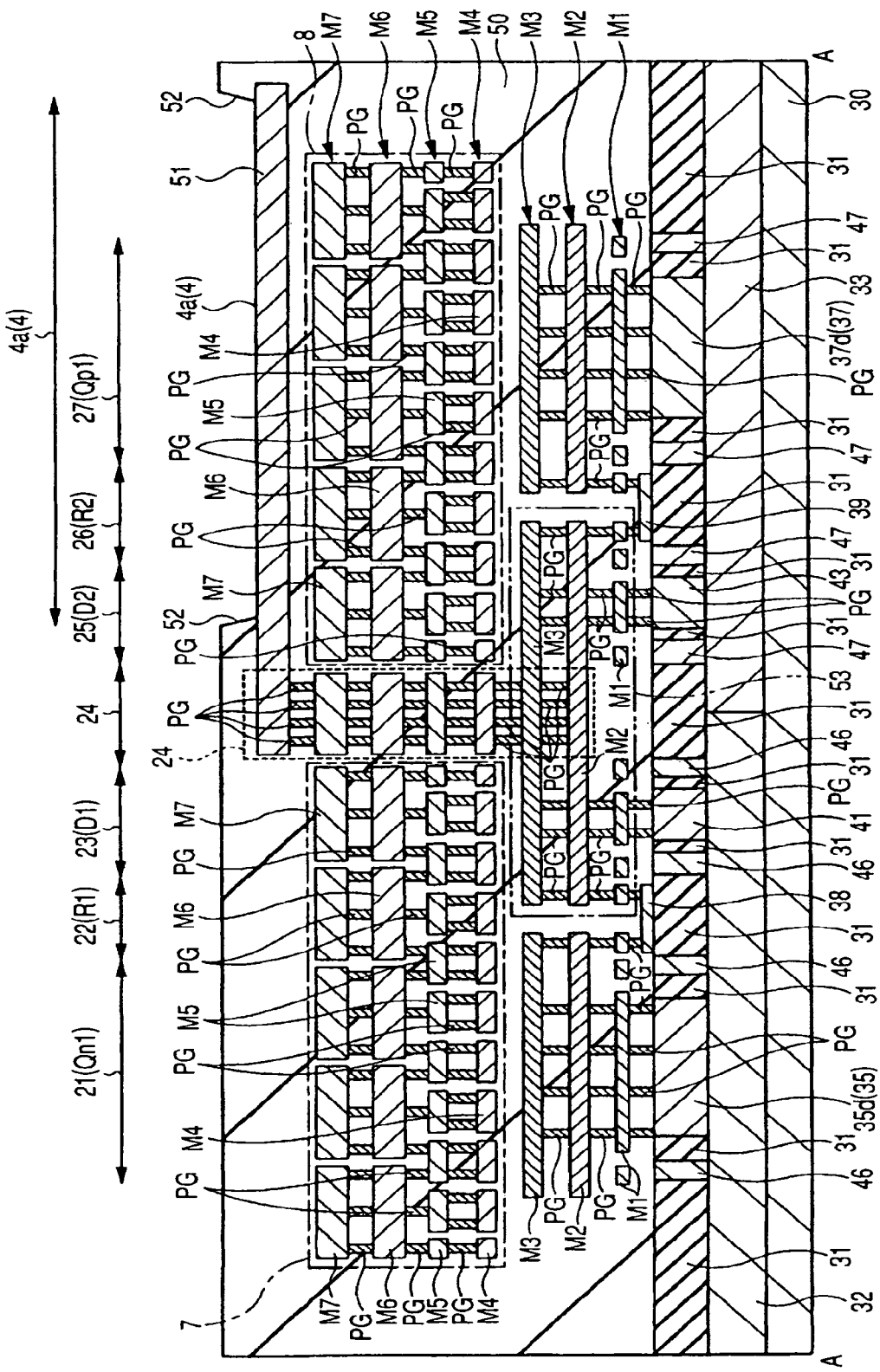
FIG. 6 is a cross section showing the principal elements of the semiconductor device according to one embodiment of the present invention.
Figure 7:
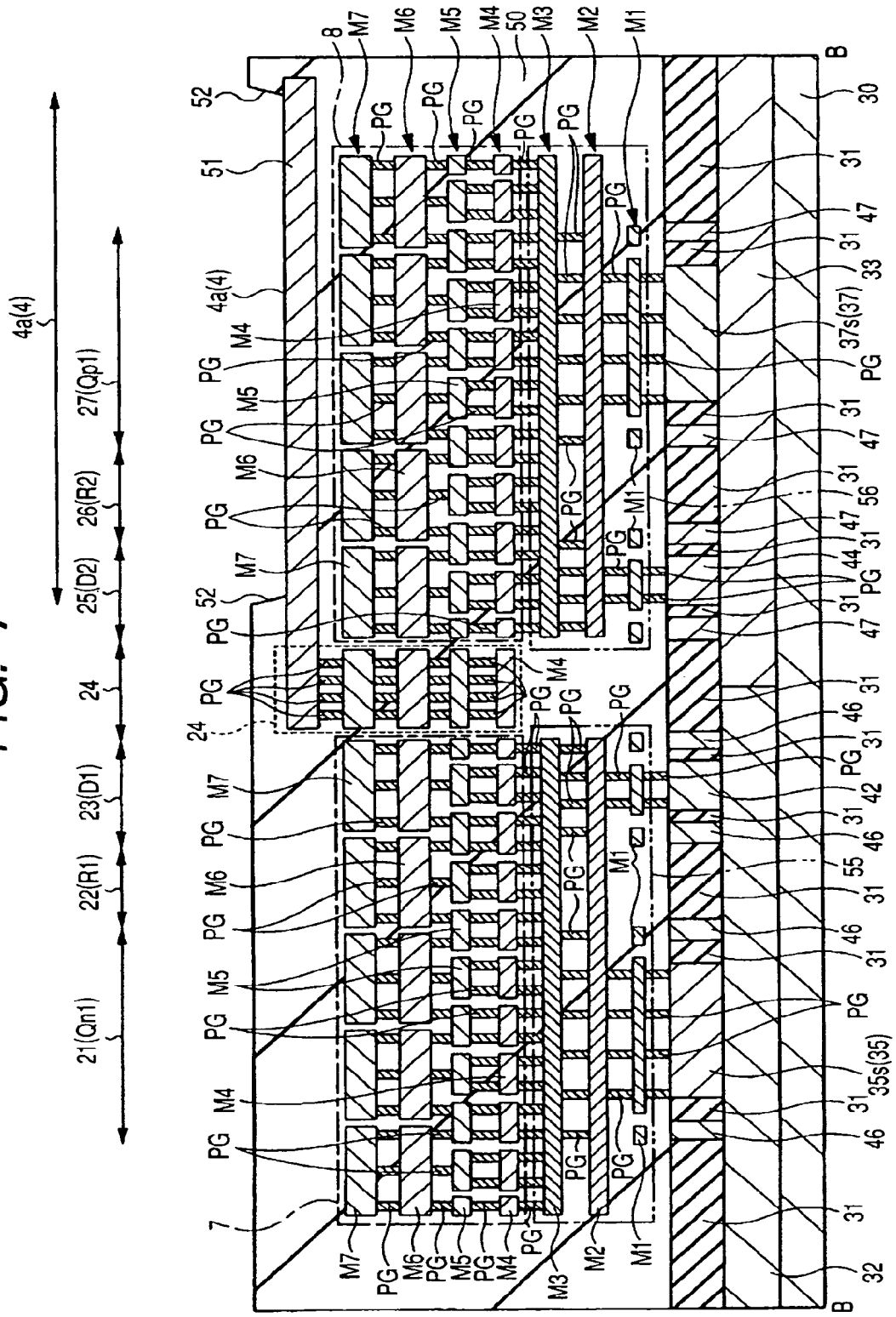
FIG. 7 is a cross section showing the principal elements of the semiconductor device according to one embodiment of the present invention.
Figure 8:
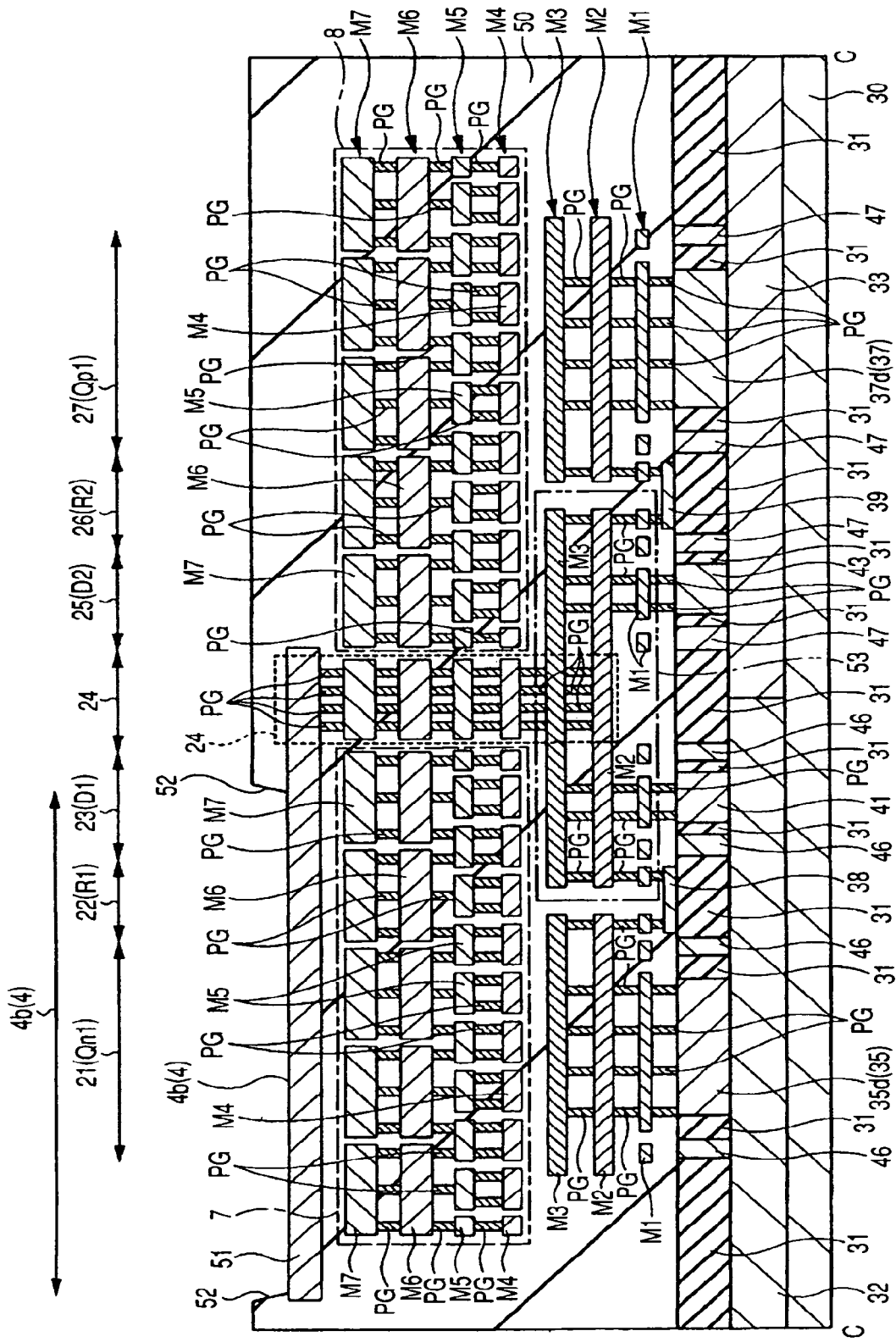
FIG. 8 is a cross section showing the principal elements of the semiconductor device according to one embodiment of the present invention.

FIGS. 6 and 8 show cross sections (in the X-direction) passing through the n-type semiconductor region 35$d$ (drain region) in the nMISFET forming region 21, the resistance element 38 in the resistance element forming region 22, the n-type semiconductor region 41 in the diode element forming region 23, the p-type semiconductor region 43 in the diode element forming region 25, the resistance element 39 in the resistance element forming region 26 and the p-type semiconductor region 37$d$ (drain region) in the pMISFET forming region 27. In addition, FIGS. 7 and 9 show cross sections (in the X-direction) passing through the n-type semiconductor region 35$s$ (source region) in the nMISFET forming region 21, the region where the resistance element 38 is not formed in the resistance element forming region 22, the p-type semiconductor region 42 in the diode element forming region 23, the n-type semiconductor region 44 in the diode element forming region 25, the region where the resistance element 39 is not formed in the resistance element forming region 26 and the p-type semiconductor region 37$s$ (source region) in the pMISFET forming region 27.

A plurality of interlayer insulating films and of wiring layers are formed over the semiconductor substrate 30. The semiconductor device 1 has a multilayer wiring structure over the semiconductor substrate 30. The cross sections shown in FIGS. 6 to 9 integrally illustrate a plurality of interlayer insulating films and the uppermost layer of a protective film (surface protective film and insulating film) as an insulating film 50 to make them easily viewable.

As shown in FIGS. 6 to 9, on the main surface 2 of the semiconductor substrate 30, a first, second, third, fourth, fifth, sixth and seventh layer wirings M1, M2, M3, M4, M5, M6 and M7 are formed in this order from the bottom. The first layer wiring M1 is formed of, for example, a patterned tungsten film and the like. The second, third, fourth, fifth, sixth and seventh layer wirings M2, M3, M4, M5, M6 and M7 are formed of an embedded copper wiring formed by a damascene method (single or dual damascene method). As another embodiment, the wirings M2 to M7 may be formed of aluminum made of aluminum alloy film on which the wirings M2 to M7 are patterned.

Interlayer insulating films (insulating film 50) including silicon oxide film or low dielectric-constant insulating film (so-called low-k film) are formed between the semiconductor substrate 30 and the first layer wiring M1 and among the wirings M1 to M7. The wirings M1 to M7 are electrically connected to one another through conductive plugs PG formed in the interlayer insulating films according to need. If the wirings M2 to M7 are formed by the dual damascene method, the plugs PG are integrally formed with the wirings M2 to M7. The first layer wiring M1 is electrically connected to elements (semiconductor elements or passive elements) formed on the main surface of the semiconductor substrate 30 through conductive plugs PG formed in the interlayer insulating films according to need.

The conductive layer (conductive film, metallic layer) 51 for the bonding pad 4 is formed over the seventh layer wiring M7 as the uppermost metallic layer (wiring layer, an eighth layer wiring). The conductive layer 51 forms the bonding pad 4. The conductive layer 51 is formed of, for instance, patterned aluminum alloy film (metallic layer). An interlayer insulating film (not shown) is formed between the conductive layer 51 and the seventh layer wiring. On the conductive layer 51 a protective film (the insulating film 50) made of an insulating material is formed to be the uppermost layer film (surface film) of the semiconductor device 1. The bonding pad 4 is formed of a part of the conductive layer 51 exposed from the opening 52 formed on the protective film. For this reason, the bonding pad 4 is integrally formed with the conductive layer 51, and a part of the conductive layer 51 is the bonding pad 4. In other words, the bonding pad 4 is formed by a part of the conductive layer 51.

The grounding wiring 7 and the power supply wiring 8 are formed by the fourth, fifth, sixth, and seventh layer wirings M4, M5, M6, and M7 and the plugs PG connecting between the wirings M4, M5, M6, and M7. The grounding wiring 7 and the power supply wiring 8 extend along the periphery (four sides) of the semiconductor device 1, i.e., along the Y-direction.

The damascene method is a technique in which a conductive film is formed on an interlayer insulating film to be embedded in a wiring opening formed in the interlayer insulating film and the conductive film outside the wiring opening is removed by a CMP method or the like to be embedded in the wiring opening to form an embedded wiring. An excessively wide wiring opening can cause dishing at the time of CMP. For this reason, in FIGS. 6 to 9, the wiring on the same layer among the wirings forming the grounding wiring 7 is divided into plural wirings and synthesized to constitute the grounding wiring 7. Similarly, the wiring on the same layer among the wirings forming the grounding wiring 8 is divided into plural wirings and synthesized to constitute the grounding wiring 8. This enables avoiding dishing at the time of CMP in the damascene method. Incidentally, in FIGS. 3 and 5, the grounding wiring 7 and the power supply wiring 8 are illustrated as an integrated pattern to make them easily viewable. If the grounding wiring 7 and the power supply wiring 8 are formed of aluminum wirings without the use of the damascene method, the wiring on the same layer among the wirings forming the grounding wiring 7 may be integrally formed, and similarly, the wiring on the same layer among the wirings forming the grounding wiring 8 may be integrally formed.

In addition, the grounding wiring 7 and the power supply wiring 8 extend to pass through over the region for forming the input/output circuit 11 in the Y-direction. In other words, the grounding wiring 7 and the power supply wiring 8 extend in the Y-direction along the periphery of the semiconductor device 1 to pass through over the nMISFET forming region 21, the resistance element forming region 22, the diode element forming region 23, the diode element forming region 25, the resistance element forming region 26 and the pMISFET forming region 27 constituting the input/output circuit 11. In the present embodiment, both the grounding wiring 7 and the power supply wiring 8 extend along the main surface 2 of the semiconductor device 1, and the power supply wiring 8 is arranged outside (on the side of the periphery of the main surface 2 of the semiconductor device 1) the grounding wiring 7. For this reason, the grounding wiring 7 passes through over the nMISFET forming region 21, the resistance element forming region 22 and the diode element forming region 23, and the power supply wiring 8 passes through over the diode element forming region 25, the resistance element forming region 26 and the pMISFET forming region 27. As another embodiment, the grounding wiring 7 may be interchanged in position with the power supply wiring 8 (i.e., the power supply wiring 8 is inside and the grounding wiring 7 is outside), in that case, it is more preferable that the nMISFET forming region 21, the resistance element forming region 22, the diode element forming region 23, the diode element forming region 25, the resistance element forming region 26 and the pMISFET forming region 27 are arranged in the opposite order.

The bonding pad 4 and the conductive layer 51 used for forming the bonding pad 4 are positioned over the grounding wiring 7 and the power supply wiring 8. The conductive layer 51 may be regarded as a conductive layer positioned over the grounding wiring 7 and the power supply wiring 8 and electrically connected to the bonding pad 4.

The bonding pad 4, the grounding wiring 7, the power supply wiring 8, the MISFET in the nMISFET forming region 21, the resistance elements 38 (R1) and 39 (R2) in the resistance element forming regions 22 and 26, the diode elements (D1 and D2) in the diode element forming regions 23 and 25 and the MISFET in the pMISFET forming region 27 are electrically connected to each other through the plugs PG, the wirings M1 to M7 and the conductive layer 51 according to need as shown in FIGS. 2 to 9, forming the input/output circuit 11 with a circuit configuration shown in FIG. 10.

The grounding wiring 7 and the power supply wiring 8 extend in the Y-direction along the periphery of the semiconductor device 1. In the present embodiment, the pulling-out region (wiring pulling-out region, wiring drawing up region, wiring taking-out region and pad taking-out section) 24 for the wiring 53 is provided between the grounding wiring 7 and the power supply wiring 8. The pulling-out region 24 is a region (part) where the wiring 53 (the first wiring) electrically connected to elements (where, the resistance elements R1 and R2 and the diode elements D1 and D2 that are protective elements constituting the input/output circuit 11) formed on the semiconductor substrate 30 and positioned under the grounding wiring 7 and the power supply wiring 8 is pulled out (taken out and drawn up) over the grounding wiring 7 and the power supply wiring 8 and connected to the conductive layer 51 for the bonding pad 4.

That is to say, the wiring 53 is electrically connected to the protective elements (the resistance elements 38 (R1) and 39 (R2) in the resistance element forming regions 22 and 26 and the diode elements D1 and D2 in the diode element forming regions 23 and 25) constituting the input/output circuit 11 formed on the semiconductor substrate 30 through the plugs PG. The wiring 53 lies under the bonding pad 4, the conductive layer 51, the grounding wiring 7 and the power supply wiring 8 and is formed of, for example, the first, second and third layer wirings M1, M2 and M3 and the plugs PG connecting the wirings M1, M2 and M3.

The wiring 53 is positioned under the grounding wiring 7 and the power supply wiring 8, however, the protective elements (the resistance elements R1 and R2 and the diode elements D1 and D2) over the semiconductor substrate 30 connected to the wiring 53 via the plugs PG need electrically connecting to the bonding pad 4, so that the wiring 53 requires to be pulled out (drawing up and taking out) over the grounding wiring 7 and the power supply wiring 8 to be electrically connected to the conductive layer 51 for the bonding pad 4. For the above reason, in the present embodiment, the wiring 53 is pulled out over the grounding wiring 7 and the power supply wiring 8 in the pulling-out region 24 between the grounding wiring 7 and the power supply wiring 8 to be electrically connected to the conductive layer 51. Thus, the pulling-out region 24 is a part (conductive portion) that electrically connects between the conductive layer 51 and the wiring 53 and includes, for example, the second, third, fourth, fifth, sixth and seventh layer wirings M2, M3, M4, M5, M6 and M7, the conductive layer 51 and the plugs PG electrically connecting therebetween.

In addition, it may be regarded that the pulling-out region 24 is arranged between a group including the nMISFET forming region 21, the resistance element forming region 22 and the diode element forming region 23 and a group including the pMISFET forming region 27, the resistance element forming region 26 and the diode element forming region 25 and the wiring 53 is pulled out over the grounding wiring 7 and the power supply wiring 8 to be electrically connected to the conductive layer 51. Furthermore, it may be regarded that the pulling-out region 24 is arranged between the nMISFET forming region 21 and the pMISFET forming region 27 of the input/output circuit 11.

As stated above, in FIGS. 6 and 8, the wiring 53 electrically connected to the conductive layer 51 for the bonding pad 4 through the pulling-out region 24 is electrically connected to one end of the resistance element 38 in the resistance element forming region 22, the n-type semiconductor region 41 in the diode element forming region 23, the p-type semiconductor region 43 in the diode element forming region 25 and one end of the resistance element 39 in the resistance element forming region 26 through the plugs PG and others. The other end of the resistance element 38 in the resistance element forming region 22 is electrically connected to the n-type semiconductor region 35d (drain region) in the nMISFET forming region 21 through the first, second and third layer wirings M1, M2 and M3 and the plugs PG. The other end of the resistance element 39 in the resistance element forming region 26 is electrically connected to the p-type semiconductor region 37d (drain region) in the pMISFET forming region 27 through the first, second and third layer wirings M1, M2 and M3 and the plugs PG. As shown in FIGS. 7 and 9, the n-type semiconductor region 35s (source region) in the nMISFET forming region 21 is electrically connected to the grounding wiring 7 through the wiring 55. The p-type semiconductor region 37s (source region) in the pMISFET forming region 27 is electrically connected to the power supply wiring 8 through the wiring 56. The wirings 55 and 56 are wirings positioned under the grounding wiring 7 and the power supply wiring 8 and include the first, second and third layer wirings M1, M2 and M3 and the plugs PG. The wirings 53, 55 and 56 are positioned on the same layer, however, they are different from each other. The circuit configuration shown in FIG. 10 is thus realized.

Furthermore, in the present embodiment, a plurality of the bonding pads 4 are staggered. That is, a plurality of the bonding pads 4 are arranged in two rows along each side of the semiconductor device 1. The position of the bonding pads 4 is displaced by half pitch between the rows. The first bonding pad 4a near the end of the semiconductor device 1 and the second bonding pad 4b positioned further inside than the first bonding pad 4a in the semiconductor device 1 are alternately arranged. For this reason, as shown in FIGS. 4 and 6, the wiring 53 is pulled out in the pulling-out region 24 to be connected to the conductive layer 51 and caused to extend along the X-direction toward the end 2a of the semiconductor device 1 and to be exposed from the opening 52 of the protective film, thereby forming the first bonding pad 4a near the end of the semiconductor device 1. As shown in FIGS. 4 and 8, the wiring 53 is pulled out in the pulling-out region 24 to be connected to the conductive layer 51 and caused to extend along the X-direction opposite to the direction toward the end 2a of the semiconductor device 1 (i.e., in the direction toward the inner side of the main surface 2 of the semiconductor device 1) and to be exposed from the opening 52 of the protective film, thereby forming the second bonding pad 4b positioned further inside than the first bonding pad 4a in the semiconductor device 1.

In addition, the grounding wiring 8 is arranged under the first bonding pad 4a. The diode element forming region 25, the resistance element forming region 26 and the pMISFET forming region 27 are arranged under the power supply wiring 8. Furthermore, the grounding wiring 7 is arranged under the second bonding pad 4b. The nMISFET forming region 21, the resistance element forming region 22 and the diode element forming region 23 are arranged under the grounding wiring 7. For this reason, the grounding wiring 7 and the power supply wiring 8 pass through over the protective elements (the resistance elements 38 (R1) and 39 (R2) in the resistance element forming regions 22 and 26 and the diode elements D1 and D2 in the diode element forming regions 23 and 25) constituting the input/output circuit 11. In addition, the bonding pad 4 is arranged (exists) over the protective elements (the resistance elements 38 (R1) and 39 (R2) in the resistance element forming regions 22 and 26 and the diode elements D1 and D2 in the diode element forming regions 23 and 25) constituting the input/output circuit 11.

Unlike the present embodiment, when the pulling-out region 24 is provided outside the power supply wiring 8 (on the side of the end 2a of the semiconductor device 1) instead of between the grounding wiring 7 and the power supply wiring 8 and the wiring 53 is pulled out over the grounding wiring 7 and the power supply wiring 8 and connected to the conductive layer 51 (hereinafter referred to as "a first comparison example"), the bonding pad is provided further outside than the pulling-out region 24, so that a semiconductor device requires to be increased in planar dimension by the bonding pad. Particularly, when the bonding pads are staggered, the bonding pads on the inner peripheral side can be arranged further inside than the pulling-out region 24, however, the bonding pads on the outer peripheral side needs to be arranged outside the pulling-out region 24, so that a semiconductor device requires to be increased in planar dimension by the bonding pad in the first comparison example. This causes a disadvantage in downsizing a semiconductor device.

In contrast to the above, in the present embodiment, the pulling-out region 24 is provided between the grounding wiring 7 and the power supply wiring 8, and the wiring 53 is pulled out over the grounding wiring 7 and the power supply wiring 8 to be (electrically) connected to the conductive layer 51. For this reason, even when the bonding pad 4 is arranged further outside than the pulling-out region 24 (on the side of the end 2a of the semiconductor device 1), the bonding pad 4 can be arranged further inside by the position where the pulling-out region 24 is positioned further inside than the power supply wiring 8. That is to say, the bonding pad 4 can be arranged over the input/output circuit 11 (I/O cell) including the nMISFET forming region 21, the resistance element forming region 22, the diode element forming region 23, the diode element forming region 25, the resistance element forming region 26 and the pMISFET forming region 27. In other word, the bonding pad 4 can be arranged over the protective elements (the resistance elements 38 (R1) and 39 (R2) in the resistance element forming regions 22 and 26 and the diode elements D1 and D2 in the diode element forming regions 23 and 25). This allows the semiconductor device 1 to be reduced in planar dimension, enabling downsizing the semiconductor device 1.

When the bonding pad 4 is staggered, in particular, it is preferable that the second bonding pad 4b on the inner peripheral side is arranged further inside than the pulling-out region 24 (on the inner side of the main surface 2 of the semiconductor device 1) and the first bonding pad 4a on the outer peripheral side is arranged further outside than the pulling-out region 24 (on the side of end 2a of the main surface 2 of the semiconductor device 1). In the present embodiment, since the pulling-out region 24 is provided between the grounding wiring 7 and the power supply wiring 8, not only the second bonding pad 4b on the inner peripheral side but the first bonding pad 4a on the outer peripheral side can be arranged over the input/output circuit 11 (I/O cell). For this reason, even when the bonding pads 4 are staggered, there is no need to increase the semiconductor device in planar dimension by the dimension of the bonding pad 4. Consequently, this allows the bonding pad 4 to be staggered without increasing the planar dimension, which makes it compatible to downsize the semiconductor device 1 and increase terminals thereof (i.e., increasing the number of the bonding pads 4 and narrowing the pitches between the bonding pad 4). The distance from the pulling-out region 24 (length along which the conductive layer 51 extends, i.e., wiring length) to both the first bonding pad 4a on the outer peripheral side and the second bonding pad 4b on the inner peripheral side can be equalized to each other, so that the characteristics of the first and second bonding pads 4a and 4b can be unified, which allows further improving the characteristics of the semiconductor device having the staggered bonding pads 4.

The power supply wiring 5 and the grounding wiring 6 do not impair the performance of the core region 3 by leaving the circular wiring on the uppermost layer.

Two MISFET elements (i.e., the nMISFET Qn1 and the pMISFET Qp1) used in the input/output circuit 11 are formed in two different regions (the nMISFET forming region 21 and the pMISFET forming region 27) respectively and the pulling-out region 24 is provided between the nMISFET forming region 21 and the pMISFET forming region 27. For this reason, the pulling-out region 24 can be arranged around the center of the input/output circuit 11, which enables the bonding pad 4 to be arranged at a position near the center of the input/output circuit 11. That is to say, even though the bonding pad 4 is arranged further outside than the pulling-out region 24 (on the side of end of the semiconductor device 1), the bonding pad 4 can be arranged further inside by the position where the pulling-out region 24 is positioned further inside (on the inner side of the main surface 2 of the semiconductor device 1) than the pMISFET forming region 27. This allows the semiconductor device 1 to be reduced in planar dimension, enabling downsizing the semiconductor device.

In addition, in the present embodiment, the grounding wiring 7 and the power supply wiring 8 are arranged over the protective elements (the resistance elements 38 (R1) and 39 (R2) in the resistance element forming regions 22 and 26 and the diode elements D1 and D2 in the diode element forming regions 23 and 25) and the nMISFET forming region 21 and the pMISFET forming region 27, i.e., over the input/output circuit 11 (I/O cell). Furthermore, the bonding pad 4 (the conductive layer 51) is arranged over the grounding wiring 7 and the power supply wiring 8. Arranging the bonding pad 4 over the protective elements (the resistance elements 38 (R1) and 39 (R2) in the resistance element forming regions 22 and 26 and the diode elements D1 and D2 in the diode element forming regions 23 and 25) and the nMISFET forming region 21 and the pMISFET forming region 27, i.e., over the input/output circuit 11 (I/O cell) eliminates the need for increasing a chip dimension owing to the bonding pad 4, which permits reducing the planar dimension of the semiconductor device 1.

Unlike the present embodiment, when the grounding wiring 7 and the power supply wiring 8 are formed by a metallic layer on the same layer as the bonding pad 4, making a detour around the input/output circuit 11 and providing the grounding wiring and the power supply wiring narrow the width of wiring of a power supply wiring to decrease current density. Alternatively, widening the width of wiring of a power supply wiring to keep current density results in increase in planar dimension of the semiconductor device.

On the other hand, in the present embodiment, the grounding wiring 7 and the power supply wiring 8 are arranged under the bonding pad 4 and over the protective elements and the nMISFET and pMISFET forming regions 21 and 27 (i.e., over the input/output circuit 11 (I/O cell), which allows widening the wiring width of the grounding wiring 7 and the power supply wiring 8 and accurately passing an EDS surge inputted into the bonding pad 4 through the grounding wiring 7 and the power supply wiring 8. Furthermore, providing the pulling-out region 24 between the grounding wiring 7 and the power supply wiring 8 permits readily realizing the grounding wiring 7 and the power supply wiring 8 that are wide in width.

Second Embodiment

Figure 11:
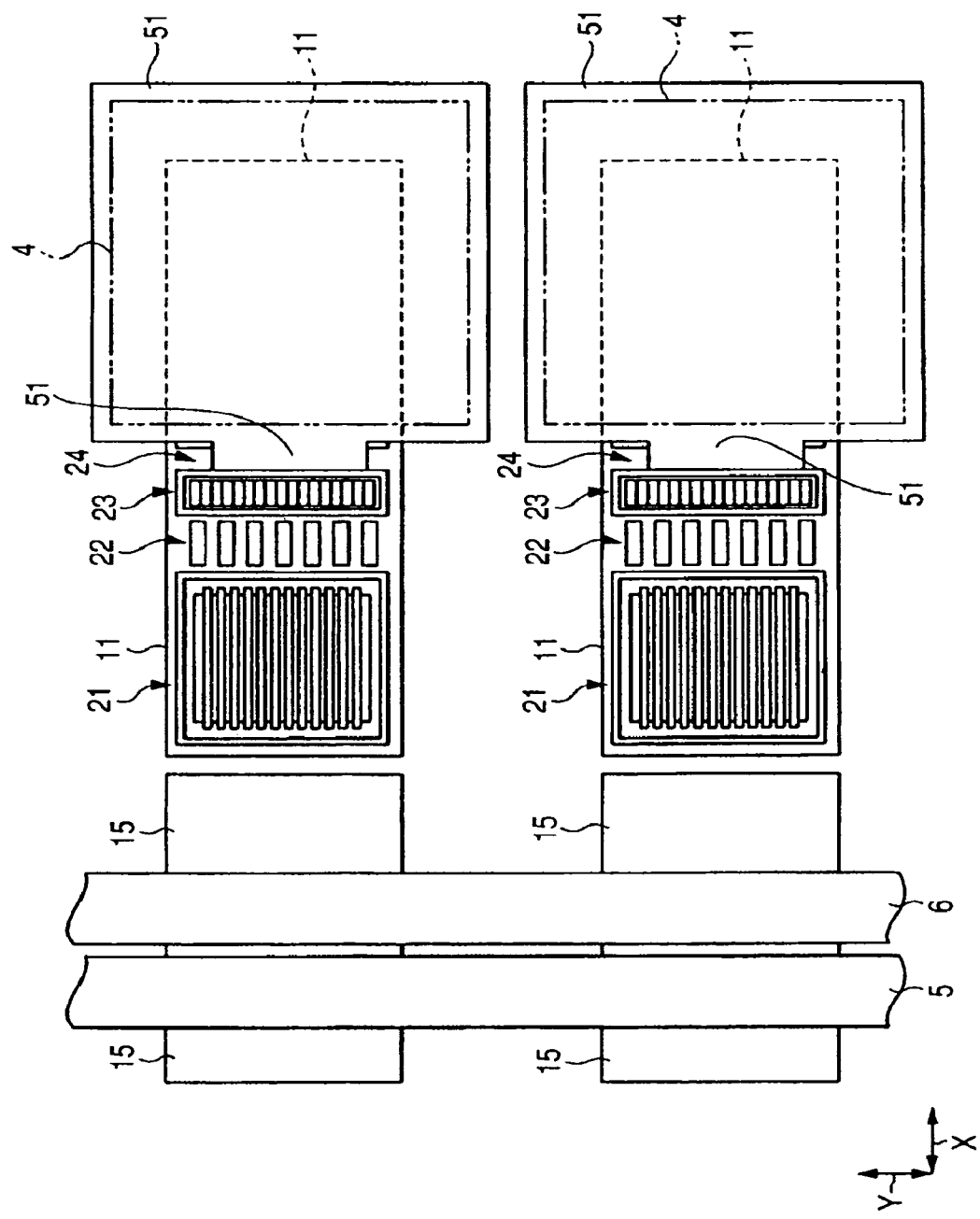
FIG. 11 is a top view showing the principal elements of the semiconductor device according to another embodiment of the present invention.

FIG. 11 is a top view showing the principal elements of the semiconductor device according to the present embodiment and corresponds to FIG. 4 in the first embodiment. As is the case with FIG. 4 in the first embodiment, FIG. 10 shows the periphery of the semiconductor device and planar layout of the input/output circuit 11, the circuit 15, the power supply wiring 5, the grounding wiring 6 and the bonding pad 4 but omits the illustration of the grounding wiring 7 and the power supply wiring 8.

In the above first embodiment, the bonding pads 4 are staggered. In the present embodiment, a plurality of bonding pads 4 are straight arranged in one row instead of being staggered. That is, all the bonding pads 4 configured in the same manner as the first bonding pad 4a in the first embodiment correspond to the present embodiment. As another embodiment, all bonding pads 4 may be configured in the same manner as the second bonding pad 4b in the first embodiment. Other configurations of the semiconductor device in the present embodiment are substantially the same as the semiconductor device 1 in the first embodiment, so that duplicated description is omitted thereof.

Effects can be similarly obtained also in the present embodiment except for those related to staggered arrangement of the bonding pads 4 in the first embodiment. For example, the wiring 53 is pulled out over the grounding wiring 7 and the power supply wiring 8 in the pulling-out region 24 between the grounding wiring 7 and the power supply wiring 8 to be connected to the conductive layer 51, which permits the bonding pads 4 to be arranged over the input/output circuit 11 (I/O cell), thereby allowing the semiconductor device 1 to be downsized.

Third Embodiment

Figure 12:
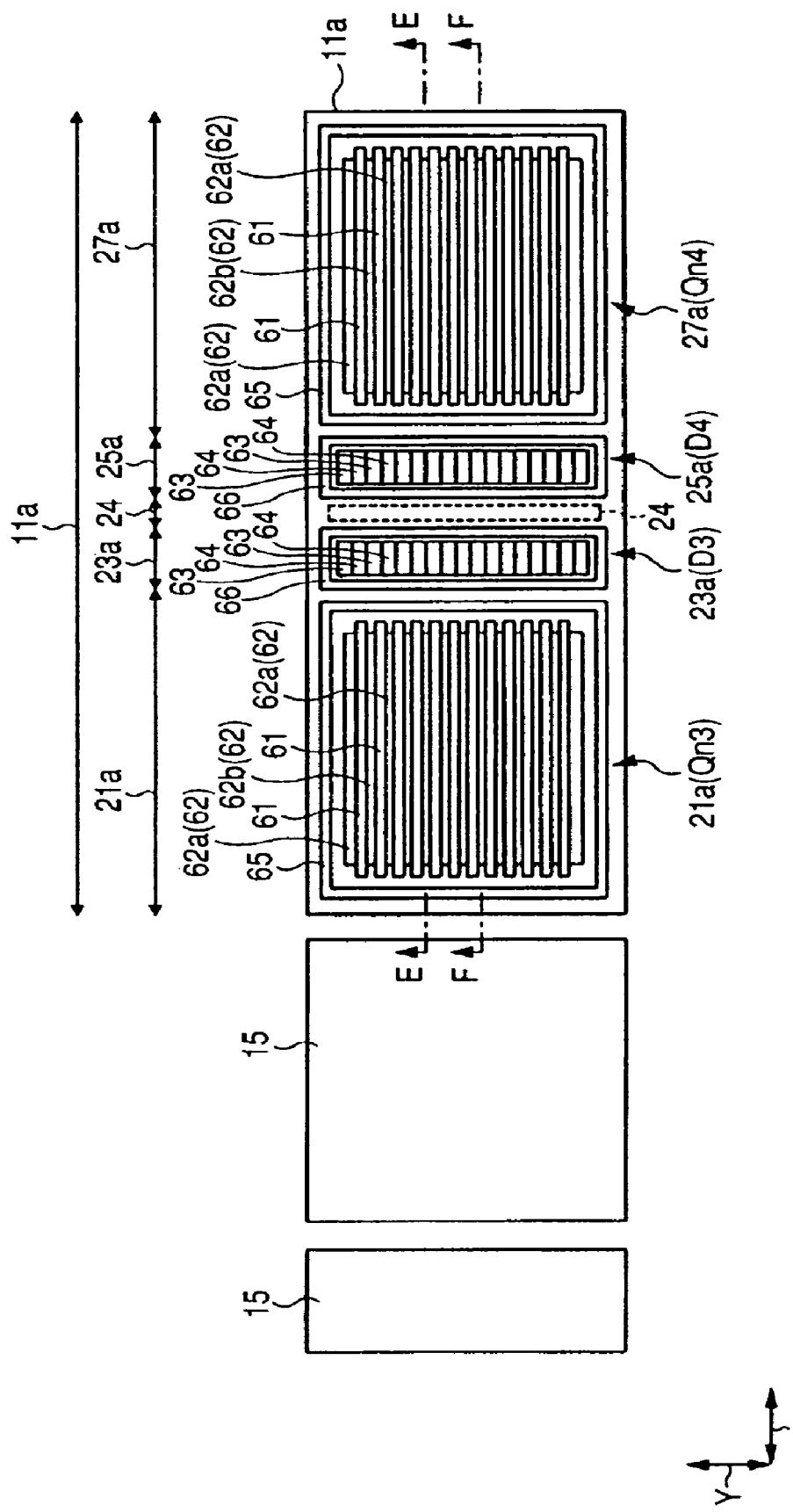
FIG. 12 is a top view showing the principal elements of the semiconductor device according to another embodiment of the present invention.
Figure 13:
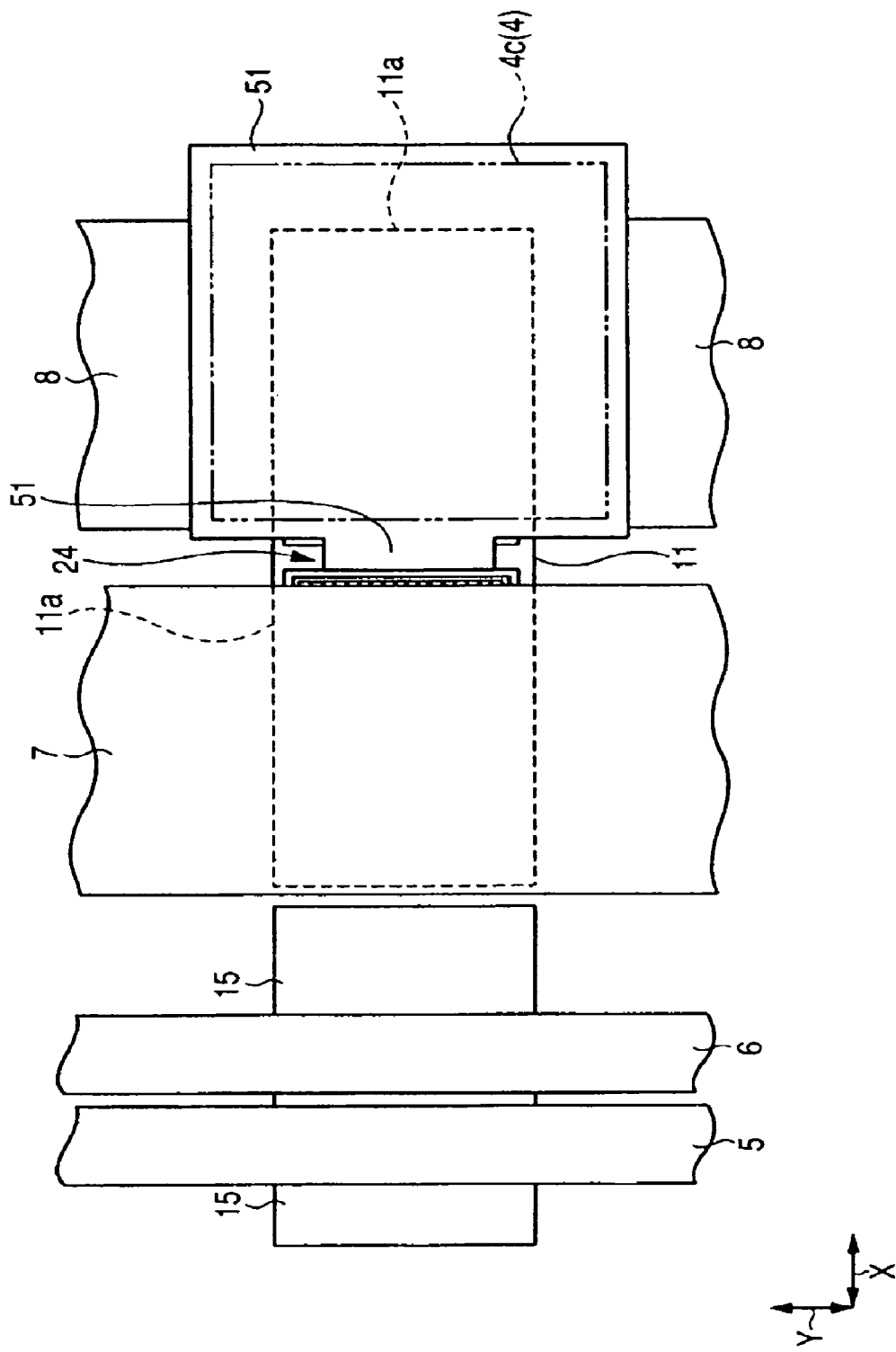
FIG. 13 is a top view showing the principal elements of the semiconductor device according to another embodiment of the present invention.
Figure 14:
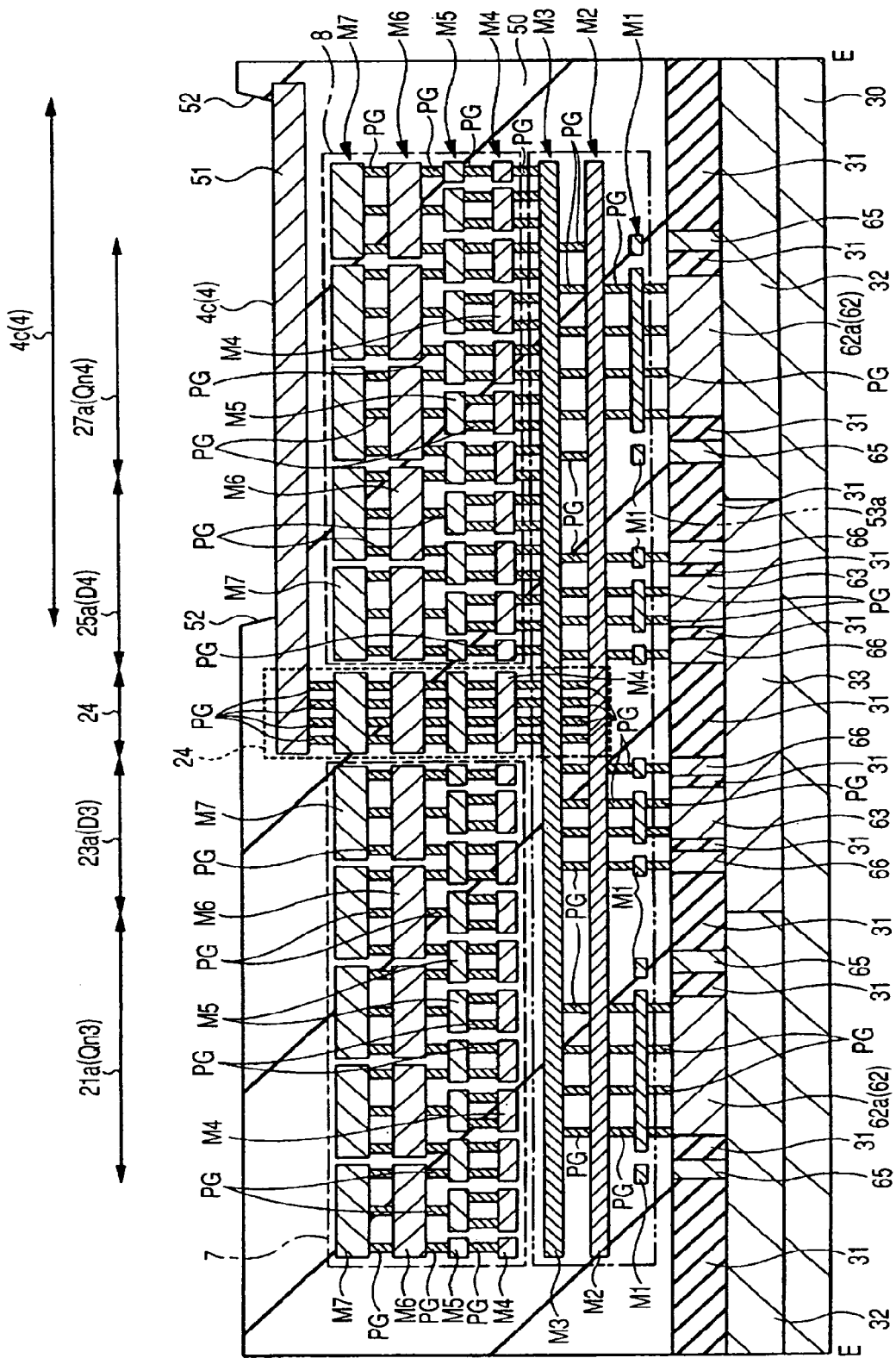
FIG. 14 is a cross section showing the principal elements of the semiconductor device according to another embodiment of the present invention.
Figure 15:
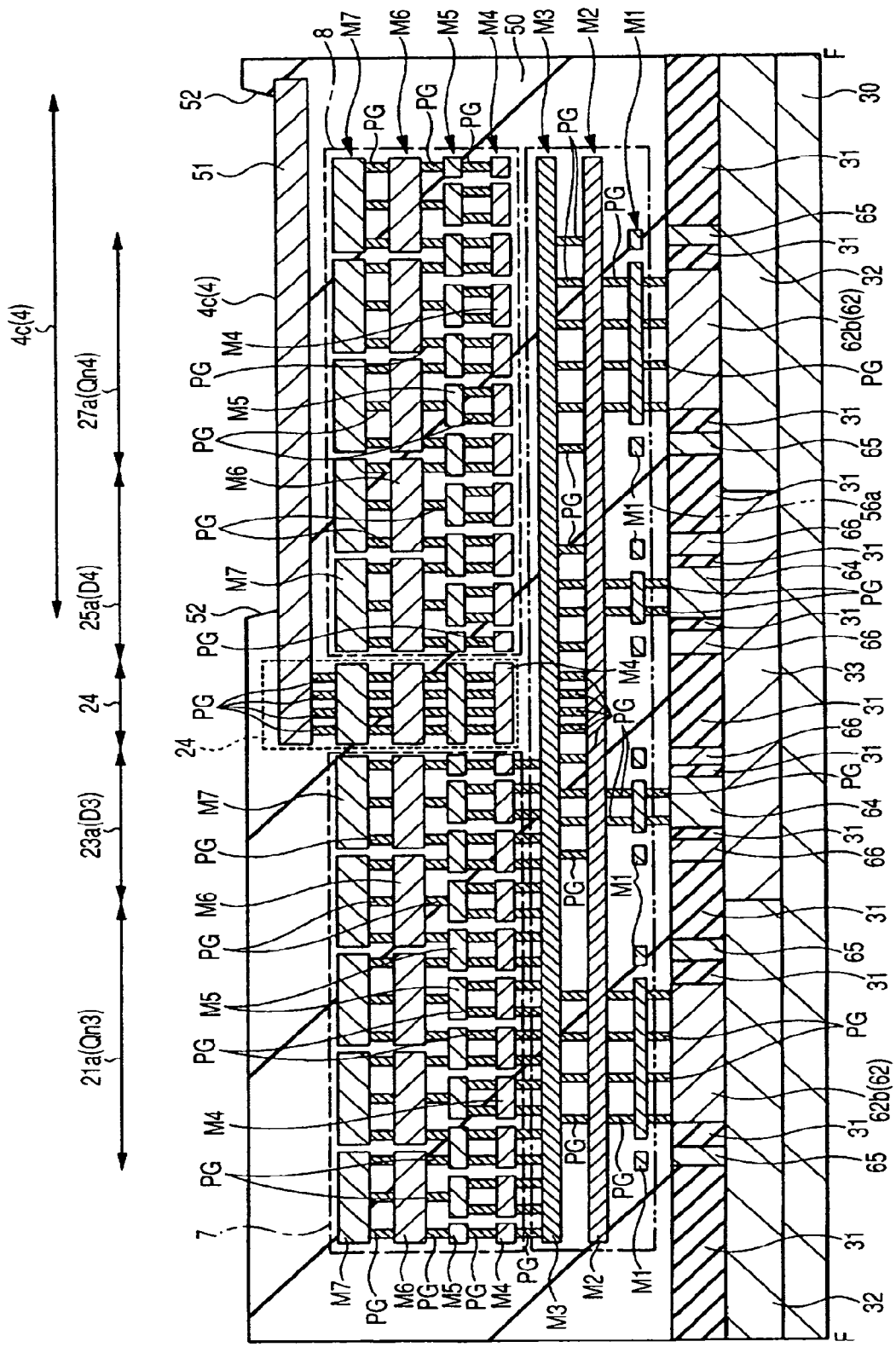
FIG. 15 is a cross section showing the principal elements of the semiconductor device according to another embodiment of the present invention.
Figure 16:
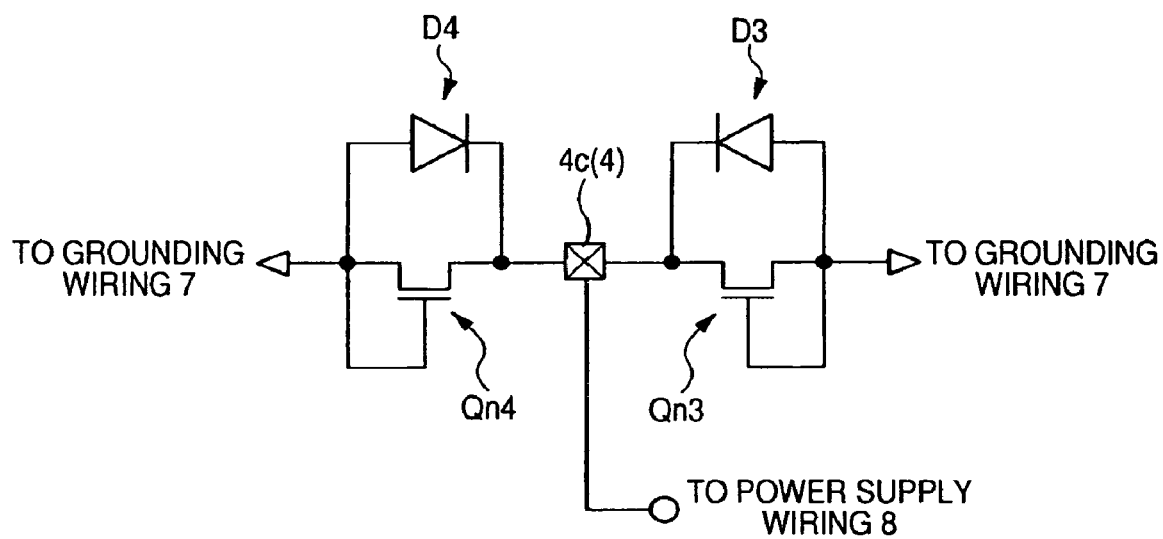
FIG. 16 is a circuit diagram showing an input/output circuit of the semiconductor device according to another embodiment of the present invention.

FIGS. 12 and 13 are top views showing the principal elements of the semiconductor device according to the present embodiment and correspond to FIGS. 2 and 5 in the above first embodiment respectively. FIGS. 12 and 13 show the same region. As is the case with FIG. 2 in the first embodiment, FIG. 12 shows the periphery of the semiconductor device and planar layout of the input/output circuit 11a and circuit 15. FIG. 13 shows the planar layout of the input/output circuit 11a, the power supply wiring 5, the grounding wiring 6, the grounding wiring 7, the power supply wiring 8, the conductive layer 51 and the bonding pad 4c. FIGS. 14 and 15 are cross sections showing the principal elements of the semiconductor device according to the present embodiment. A cross section along line E-E in FIG. 12 substantially corresponds to FIG. 14. A cross section along line F-F in FIG. 12 substantially corresponds to FIG. 15. FIG. 16 is a circuit diagram (equivalent circuit) showing an input/output circuit 11a.

The bonding pad 4c and the input/output circuit 11a are illustrated in FIGS. 12 to 16. The bonding pad 4c, among a plurality of the bonding pads 4 provided along the periphery of main surface the semiconductor device as shown in FIG. 1, is used for supplying power supply voltage (power supply electric potential) to the power supply wiring 8. The input/output circuit 11a is a circuit constituting an I/O power supply cell and the circuit configuration thereof is illustrated in FIG. 16. As can be seen from the circuit diagram in FIG. 16, the input/output circuit 11a has n-channel MISFETs Qn3 and Qn4 for protection (hereinafter referred to as "nMISFET Qn3" and "nMISFET Qn4") and the diodes D3 and D4 for protection. The bonding pad 4c is electrically connected directly to the power supply wiring 8 and electrically connected to the grounding wiring 7 through nMISFETs Qn3 and Qn4 and the diodes D3 and D4 as protective elements.

Specifically, the bonding pad 4c is electrically connected to the grounding wiring 7 through the diode D3 and electrically connected to the grounding wiring 7 through the diode D4. That is, the bonding pad 4c is electrically connected to one of the anode or the cathode of the diode D3, and the other of the anode or the cathode of the diode D3 is electrically connected to the grounding wiring 7. In addition, the bonding pad 4c is electrically connected to one of the anode or the cathode of the diode D4, and the other of the anode or the cathode of the diode D4 is electrically connected to the grounding wiring 7.

Furthermore, the bonding pad 4c is electrically connected to one of the source or the drain of the nMISFET Qn3, and the other of the source or the drain of the nMISFET Qn3 and the gate electrode thereof are electrically connected to the grounding wiring 7. In addition, the bonding pad 4c is electrically connected to one of the source or the drain of the nMISFET Qn4, and the other of the source or the drain of the nMISFET Qn4 and the gate electrode thereof are electrically connected to the grounding wiring 7.

The nMISFETs Qn3 and Qn4 and the diodes D3 and D4 constituting the input/output circuit 11a function as protective elements. For instance, when a surge (ESD surge) is inputted into the bonding pad 4c, it can be passed to the grounding wiring 7 through the nMISFETs Qn3 and Qn4 and the diodes D3 and D4. Thus, the input/output circuit 11a functions as a protective circuit (for I/O power supply cell).

As shown in FIGS. 12 to 15, an nMISFET forming region 21a, a diode element forming region 23a, an pulling-out region 24, a diode element forming region 25a and an nMISFET forming region 27a are arranged at the periphery of the main surface 2 of the semiconductor device 1 in this order in the direction from the inside (the inner side of the main surface 2 of the semiconductor device 1) to the periphery (the side of the end 2a of main surface 2 of the semiconductor device 1) i.e., in the X-direction. The nMISFET forming region 21a is a region where an MISFET corresponding to the nMISFET Qn3 is formed and the diode element forming region 23a is a region where a diode element corresponding to the diode element D3 is formed. The diode element forming region 25a is a region where a diode element corresponding to the diode element D4 is formed. The nMISFET forming region 27a is a region where an MISFET corresponding to the nMISFET Qn4 is formed. Therefore, the input/output circuit 11a is formed by the nMISFET forming region 21a (nMISFET Qn3), the diode element forming region 23a (the diode element D3), the diode element forming region 25a (the diode element D4) and the nMISFET forming region 27a (nMISFET Qn4). The input/output circuit 11a is provided in the vicinity of the bonding pad 4c.

The configuration of periphery of the semiconductor device (around the bonding pad 4c) according to the present embodiment is described in further detail with reference to FIGS. 12 to 15.

In the present embodiment, as shown in FIGS. 14 and 15, a p-type well 32 and an n-type well 33 are formed on the main surface of the semiconductor substrate 30. The p-type well 32 is formed in the region two-dimensionally including the nMISFET forming regions 21a and 27a. The n-type well 33 is formed in the region two-dimensionally including the diode element forming regions 23a and 25a.

The nMISFET forming regions 21a and 27a are substantially the same in configuration. The nMISFET forming regions 21a and 27a are similar in configuration to the nMISFET forming region 21 in the first embodiment. That is, in the nMISFET forming regions 21a and 27a, a plurality of gate electrodes 61 are so formed as to extend in the X-direction through a gate insulating film (not shown) over the p-type well 32, and the n-type semiconductor regions (n-type diffused layer) 62 as a source and a drain are formed in the regions on both sides of the gate electrodes 61. Incidentally, among the n-type semiconductor regions 62, the n-type semiconductor region 62a functions as one of a source or a drain and the n-type semiconductor region 62b functions as the other of a source or a drain. The gate electrodes 61, the gate insulating film (not shown) and the n-type semiconductor region 62 (62a and 62b) as a source and a drain under the gate electrodes 61 form the n-type MISFET constituting the nMISFETs Qn3 and Qn4 in the nMISFET forming regions 21a and 27a.

The diode element forming regions 23a and 25a are substantially the same in configuration. The diode element forming regions 23a and 25a are similar in configuration to the diode element forming regions 23 and 25 in the first embodiment. That is, in the diode element forming regions 23a and 25a, the n-type semiconductor region (n-type diffused layer) 63 and the p-type semiconductor region (p-type diffused layer) 64 are two-dimensionally formed adjacently to each other on the n-type well 33. For example, the n-type semiconductor region 63 and the p-type semiconductor region 64 extending in the X-direction are alternately arranged in the Y-direction. The diode element (the diode element constituting the diode elements D3 and D4) is formed by a PN junction between the n-type semiconductor region 63 and the p-type semiconductor region 64 in the diode element forming regions 23a and 25a. Incidentally, the p-type semiconductor region 64 may be constructed of a part of the n-type well 33.

P-type semiconductor regions (p-type diffused layer) 65 as a guard ring are formed in the nMISFET forming regions 21a and 27a, and n-type semiconductor regions (n-type diffused layer) 66 as a guard ring are formed in the diode element forming regions 23a and 25a. The p-type semiconductor regions 65 may be constructed of a part of the p-type well 32 and the n-type semiconductor regions 66 may be constructed of a part of the n-type well 33.

FIG. 14 shows a cross section (in the X-direction) passing through the n-type semiconductor regions 62a in the nMISFET forming regions 21a and 27a and the n-type semiconductor regions 63 in the diode element forming regions 23a and 25a. In addition, FIG. 15 shows a cross section (in the X-direction) passing through the n-type semiconductor regions 62b in the nMISFET forming regions 21a and 27a and the n-type semiconductor regions 64 in the diode element forming regions 23a and 25a.

As is the case with the first embodiment, a multilayer wiring structure formed of a plurality of interlayer insulating films (integrally illustrated as the insulating film 50) and of wiring layers (wirings M1 to M7) is laid over the semiconductor substrate 30. Also, as is the case with the first embodiment, the grounding wiring 7 and the power supply wiring 8 are formed by the fourth, fifth, sixth and seventh layer wirings M4, M5, M6 and M7 and the plugs PG connecting between the wirings M4, M5, M6 and M7. Furthermore, the grounding wiring 7 and the power supply wiring 8 extend in the Y-direction along the periphery of the semiconductor device to pass through over the protective elements (the nMISFET forming regions 21a and 27a and the diode element forming regions 23a and 25a) constituting the input/output circuit 11a. In this case, the grounding wiring 7 passes through over the nMISFET forming region 21a and the diode element forming region 23a. The power supply wiring 8 passes through over the diode element forming region 25a and the nMISFET forming region 27a.

As is the case with the bonding pad 4 in the first embodiment, the conductive layer 51 being the uppermost metallic layer is exposed from the opening 52 of the protective film (illustrated as the insulating film 50) to form the bonding pad 4c. The bonding pad 4c is integrally formed with the conductive layer 51, and a part of the conductive layer 51 is the bonding pad 4c. The conductive layer 51 may be regarded as a conductive layer positioned over the grounding wiring 7 and the power supply wiring 8 and electrically connected to the bonding pad 4c.

The bonding pad 4c is arranged over the protective elements (the nMISFET forming regions 21a and 27a and the diode element forming regions 23a and 25a) constituting the input/output circuit 11a. In FIGS. 14 and 15, the bonding pad 4c is arranged over the diode element forming region 25a and the nMISFET forming region 27a, however, as another embodiment, the bonding pad 4c may be arranged over the nMISFET forming region 21a and the diode element forming region 23a by forming a pattern of the conductive layer 51 as in the case of the second bonding pad 4b in the first embodiment.

The conductive layer 51 for the bonding pad 4c is electrically connected to a wiring 53a under the grounding wiring 7 and the power supply wiring 8 through the pulling-out region 24. The wiring 53a, as shown in FIG. 14, is connected to the power supply wiring 8 through the plugs PG and electrically connected to the n-type semiconductor region 63 in the diode element forming regions 23a and 25a and the n-type semiconductor region 62a in the nMISFET forming regions 21a and 27a through the plugs PG. The wiring 53a correspond to the wiring 53 in the above first embodiment. As shown in FIG. 15, the p-type semiconductor region 64 in the diode element forming regions 23a and 25a and the n-type semiconductor region 62b in the nMISFET forming regions 21a and 27a are electrically connected to the wiring 56a through the plugs PG. The wiring 56a is electrically connected to the grounding wiring 7 over the wiring 56a through the plugs PG. The wiring 56a corresponds to the wirings 55 and 56 in the first embodiment. Wirings 53a and 56a are wirings positioned under the conductive layer 51, the grounding wiring 7 and the power supply wiring 8, and include the first, second and third layer wirings M1, M2 and M3 and the plugs PG. The wirings 53a and 56a are on the same layer, but different from each other. The circuit configuration shown in FIG. 16 is thus realized.

The wiring 53a is electrically connected to the protective elements (MISFET Qn3 and Qn4 in the nMISFET forming regions 21a and 27a and the diode elements D3 and D4 in the diode element forming regions 23a and 25a) formed over the semiconductor substrate 30 through the plugs PG. The wiring 53a positioned under the grounding wiring 7 and the power supply wiring 8 needs to be electrically connected to the bonding pad 4c. As is the case with the first embodiment, also in the present embodiment, the pulling-out region 24 is provided between the grounding wiring 7 and the power supply wiring 8, and the wiring 53a is pulled out over the grounding wiring 7 and the power supply wiring 8 to be connected to the conductive layer 51 in the pulling-out region 24.

In the present embodiment, the nMISFET of a protective element constituting the input/output circuit 11a as a protective circuit is divided and formed into the nMISFET forming regions 21a and 27a and the diode element of a protective element constituting the input/output circuit 11a is divided and formed into two diode element forming regions 23a and 25a. The pulling-out region 24 is arranged between a group including the nMISFET forming region 21a and the diode element forming region 23a and a group including the diode element forming region 25a and the nMISFET forming region 27a. The wiring 53a is pulled out over the grounding wiring 7 and the power supply wiring 8 to be electrically connected to the conductive layer 51. Furthermore, it may be regarded that the pulling-out region 24 is arranged between the nMISFET forming region 21a and the nMISFET forming region 27a.

In the present embodiment, such a configuration enables providing substantially the same effect as in the first embodiment.

For example, as is the case with the first embodiment, also in the present embodiment, the pulling-out region 24 is provided between the grounding wiring 7 and the power supply wiring 8; and the wiring 53a is pulled out over the grounding wiring 7 and the power supply wiring 8 to be connected to the conductive layer 51, so that the bonding pad 4c can be arranged further inside, allowing the planar dimension of the semiconductor device (a semiconductor chip) to be reduced, which permits downsizing the semiconductor device.

In addition, the protective elements (nMISFET and diode element) constituting the input/output circuit 11a are divided into two respective regions to arrange the pulling-out region 24 between the nMISFET forming regions 21a and 27a and between the diode element forming regions 23a and 25a. The wiring 53a is pulled out over the grounding wiring 7 and the power supply wiring 8 to be connected to the conductive layer 51. Particularly, the nMISFET forming region occupying a larger area than the diode element forming regions 23a and 25a is divided into two regions (i.e., the nMISFET forming region 21a and 27a) and the pulling-out region 24 is arranged between the nMISFET forming regions 21a and 27a. This enables the pulling-out region 24 to be arranged around the center of the region for forming the input/output circuit 11a, which permits the bonding pad 4c to be arranged at a position near the center of the input/output circuit 11a. That is to say, even when the bonding pad 4c is arranged outside the pulling-out region 24 (on the side of end of the semiconductor device 1), the bonding pad 4 can be arranged further inside by the position where the pulling-out region 24 is positioned further inside than the nMISFET forming region 27a. This allows the semiconductor device to be reduced in planar dimension to downsize the semiconductor device.

Fourth Embodiment

Figure 17:
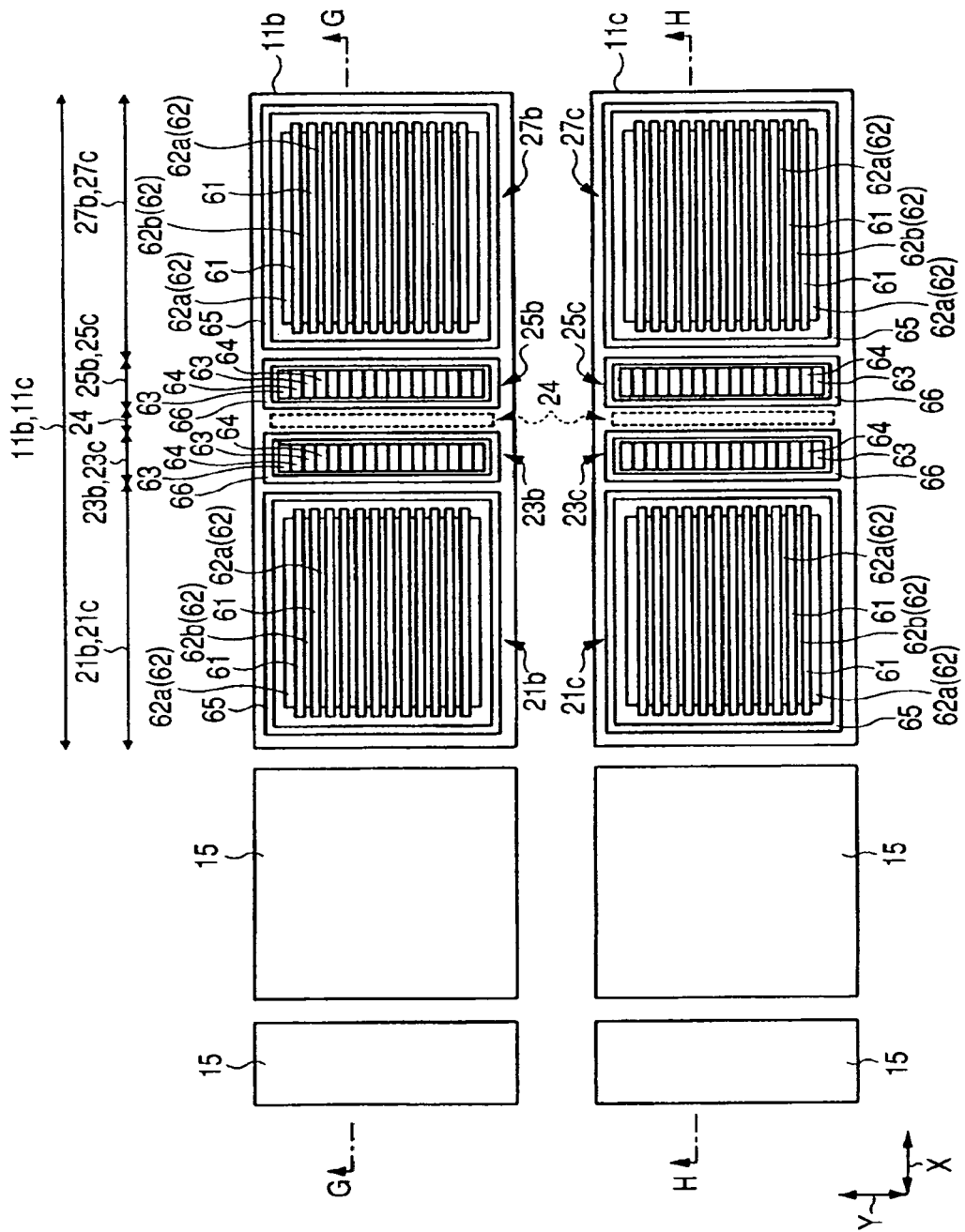
FIG. 17 is a top view showing the principal elements of the semiconductor device according to another embodiment of the present invention.
Figure 18:
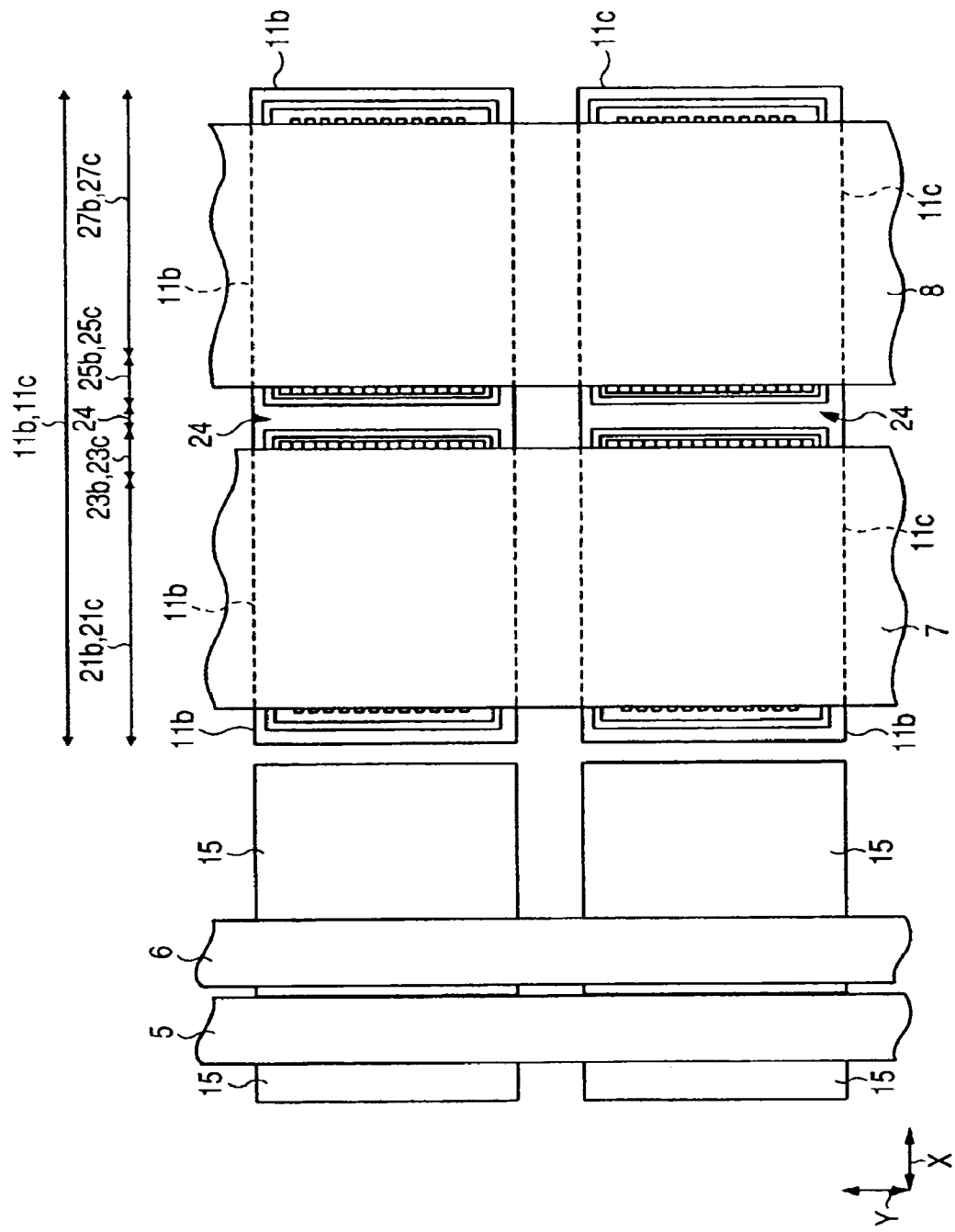
FIG. 18 is a top view showing the principal elements of the semiconductor device according to another embodiment of the present invention.
Figure 19:
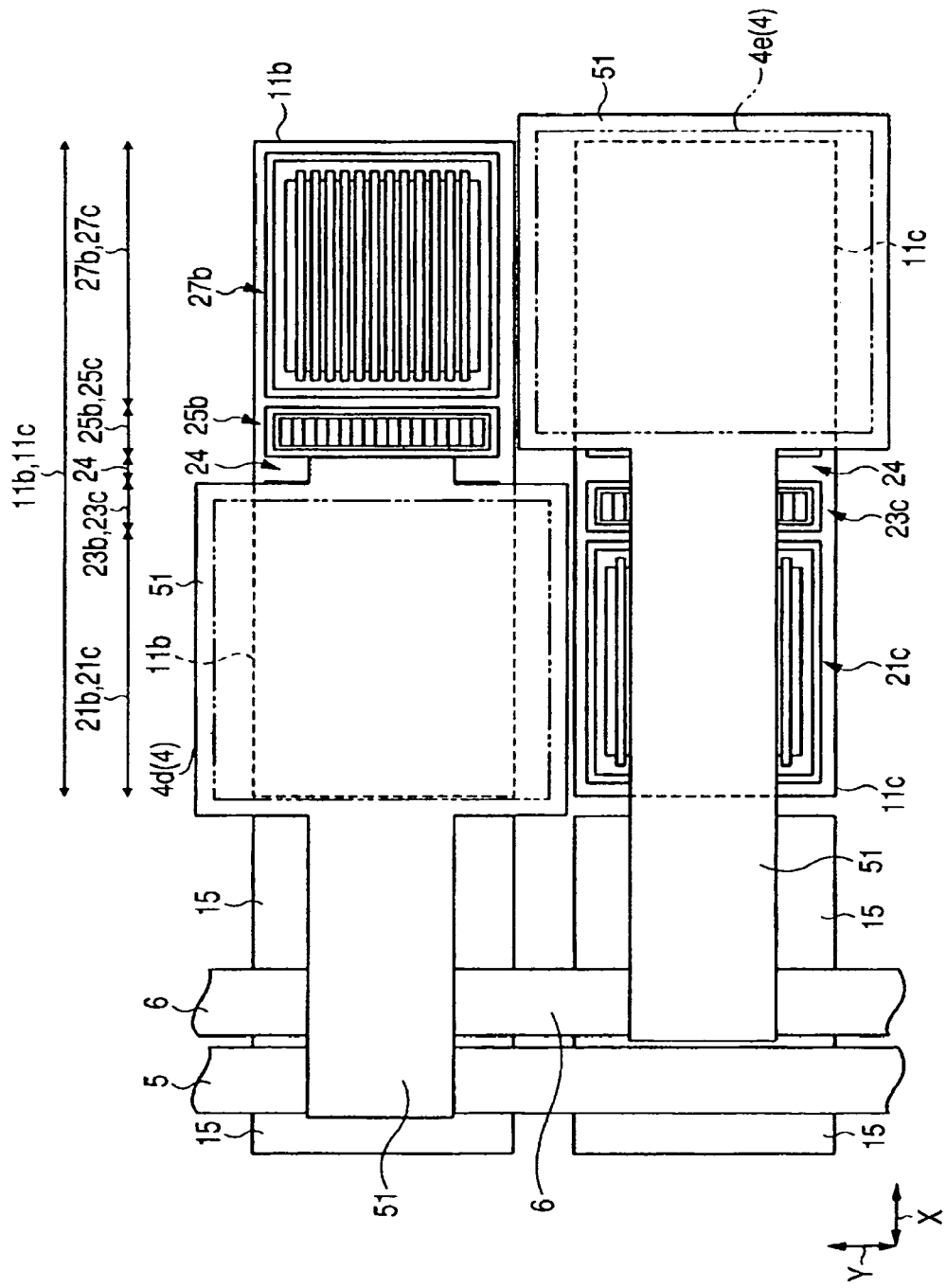
FIG. 19 is a top view showing the principal elements of the semiconductor device according to another embodiment of the present invention.
Figure 20:
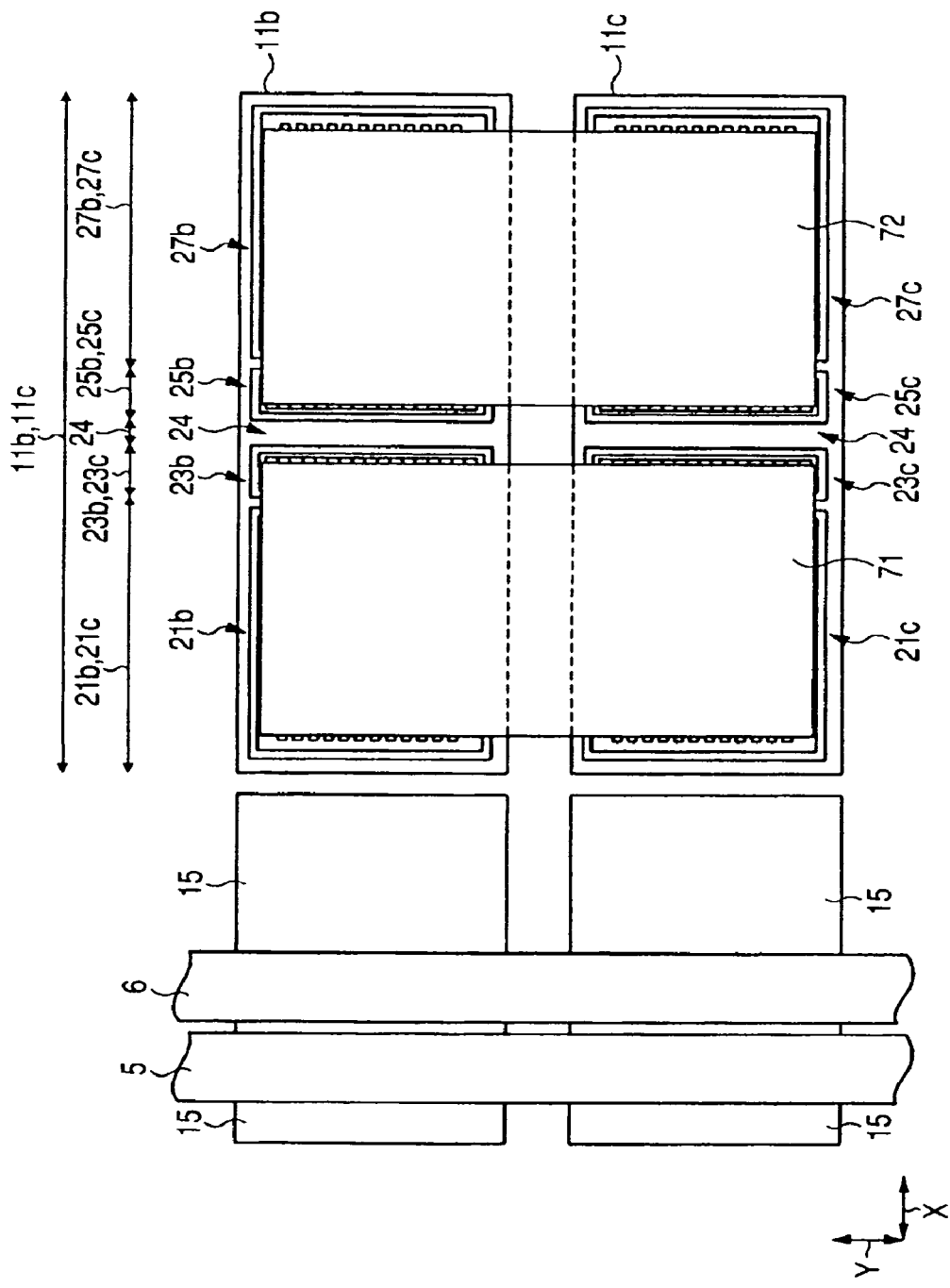
FIG. 20 is a top view showing the principal elements of the semiconductor device according to another embodiment of the present invention.
Figure 21:
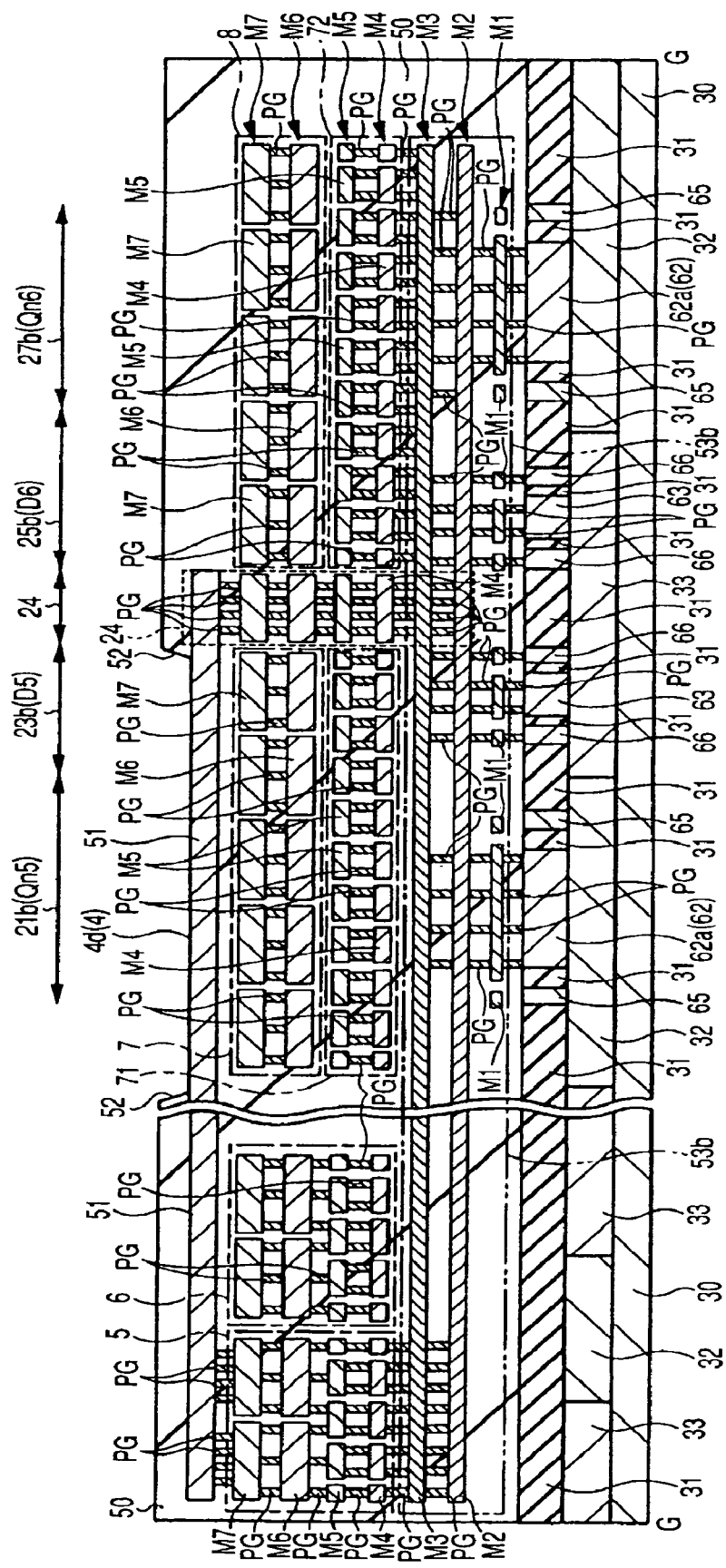
FIG. 21 is a cross section showing the principal elements of the semiconductor device according to another embodiment of the present invention.
Figure 22:
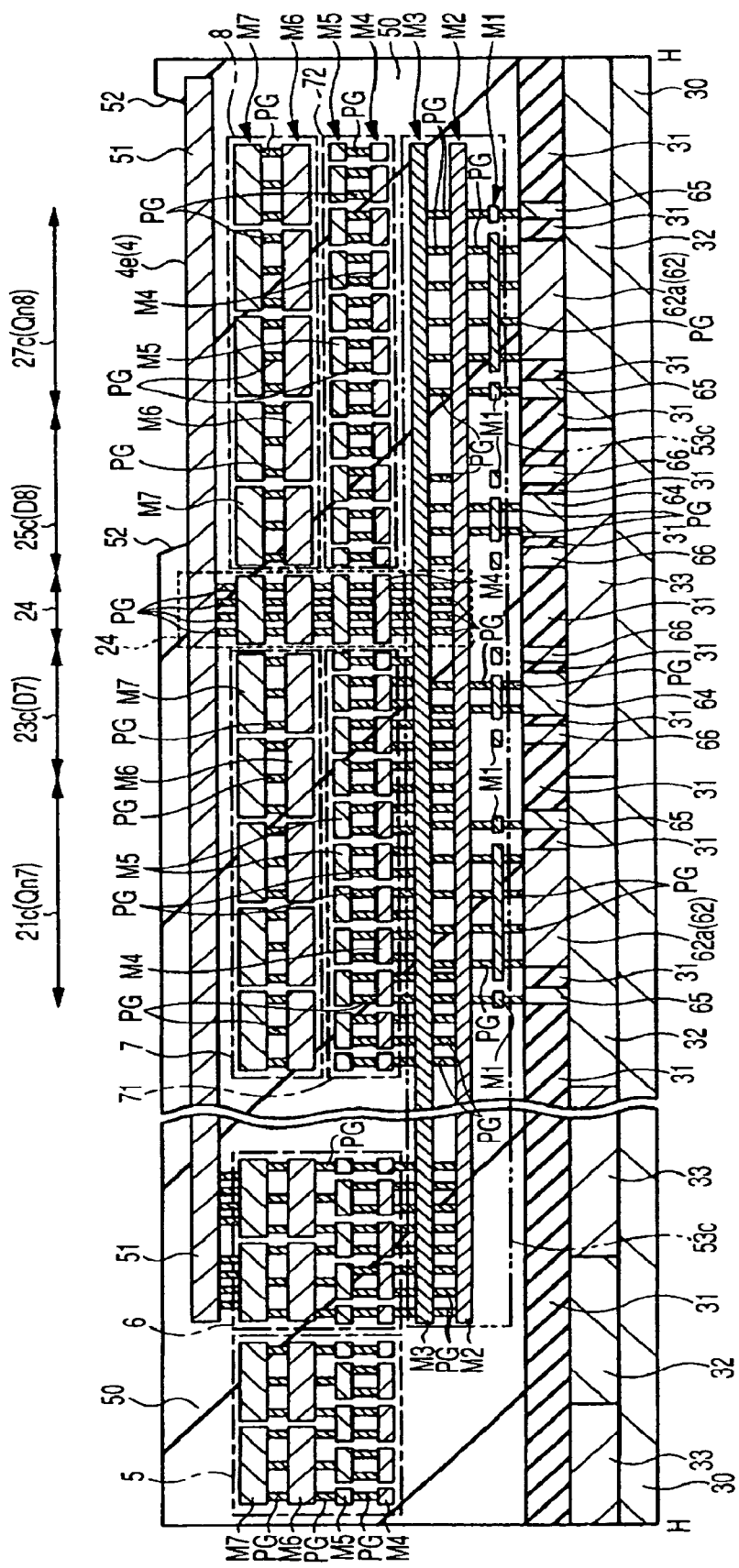
FIG. 22 is a cross section showing the principal elements of the semiconductor device according to another embodiment of the present invention.
Figure 23:
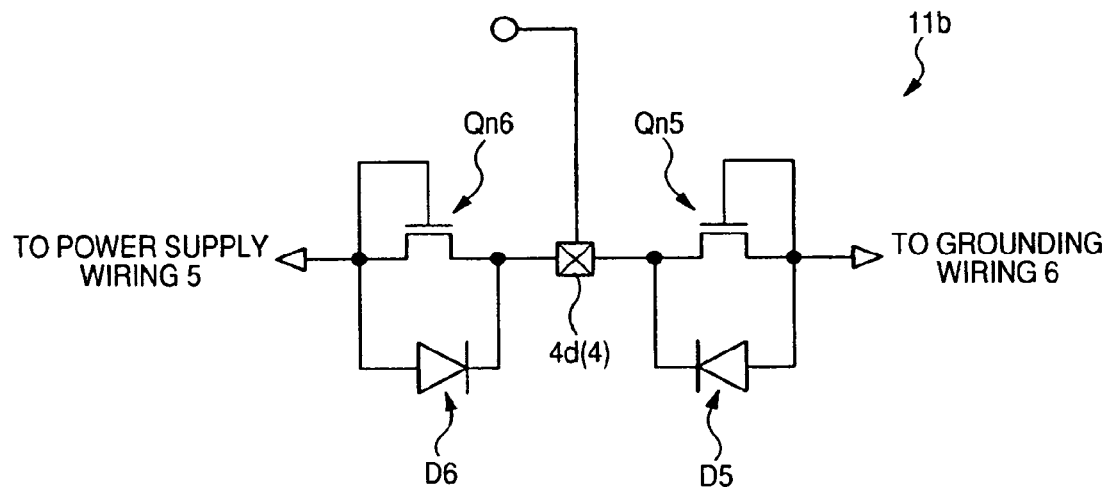
FIG. 23 is a circuit diagram showing an input/output circuit of the semiconductor device according to another embodiment of the present invention; and, FIG. 24 is a circuit diagram showing an input/output circuit of the semiconductor device according to another embodiment of the present invention.

FIGS. 17 to 20 are top views showing the principal elements of the semiconductor device according to the present embodiment. FIGS. 17 to 20 correspond to FIGS. 2 to 4 in the first embodiment respectively. FIGS. 17 and 20 show the same region. Similarly to FIG. 2 in the first embodiment, FIG. 17 shows the periphery of the semiconductor device and planar layout of the input/output circuits 11b and 11c and circuit 15. FIG. 18 corresponds to a figure in which the power supply wiring 5, the grounding wiring 6, the grounding wiring 7 and the power supply wiring 8 are added to FIG. 17. FIG. 19 corresponds to a figure in which the power supply wiring 5, the grounding wiring 6, the conductive layer 51 and the bonding pad 4 are added to FIG. 17. FIG. 20 corresponds to a figure in which the power supply wiring 5, the grounding wiring 6 and the wirings 71 and 72 are added to FIG. 17. FIGS. 21 and 22 are cross sections showing the principal elements of the semiconductor device according to the present embodiment. A cross section along line G-G in FIG. 17 substantially corresponds to FIG. 17. A cross section along line H-H in FIG. 17 substantially corresponds to FIG. 22. FIG. 23 is a circuit diagram (equivalent circuit) showing an input/output circuit 11b FIG. 24 is a circuit diagram (equivalent circuit) showing an input/output circuit 11c.

Figure 24:
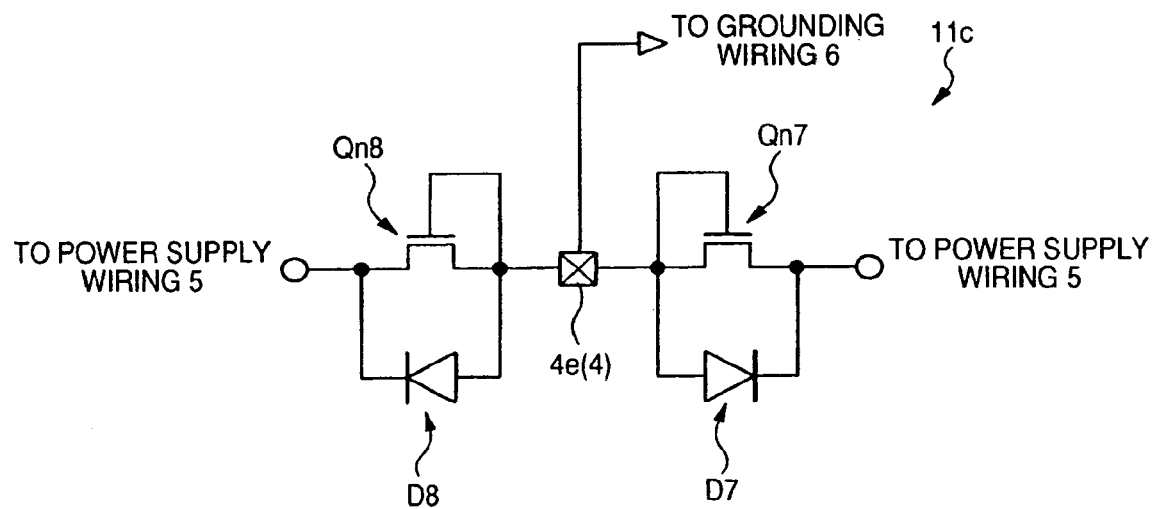

Bonding pads 4d and 4e and the input/output circuits 11b and 11c are shown in FIGS. 17 to 24. The bonding pad 4d, among a plurality of the bonding pads 4 provided along the periphery of main surface of the semiconductor device shown in FIG. 1, is for supplying power supply voltage (power supply electric potential) to the power supply wiring 5. The bonding pad 4e, among a plurality of the bonding pads 4 provided along the periphery of main surface of the semiconductor device shown in FIG. 1, is for supplying grounding voltage (grounding electric potential) to the grounding wiring 6. The input/output circuit 11b is for constituting a core power-supplying cell and is configured as shown in FIG. 23. The input/output circuit 11c is for constituting a core GND-supplying cell and is configured as shown in FIG. 24.

That is to say, as can be seen from FIG. 23, the input/output circuit 11b has protective n-channel MISFETs Qn5 and Qn6 (hereinafter referred to as "nMISFET Qn5" and "nMISFET Qn6") and protective diodes D5 and D6. The bonding pad 4d is electrically and directly connected to the power supply wiring 5 and electrically connected to the grounding wiring 6 through nMISFETs Qn5 and Qn6 and the diodes D5 and D6 acting as protective elements.

Specifically, the bonding pad 4d is electrically connected to the grounding wiring 6 through the diode element D5 and to the grounding wiring 6 through the diode element D6. In other words, the bonding pad 4d is electrically connected to one of the anode or the cathode of the diode D5 and the other of the anode or the cathode of the diode D5 is electrically connected to the grounding wiring 6. In addition, the bonding pad 4d is electrically connected to one of the anode or the cathode of the diode D6 and the other of the anode or the cathode of the diode D6 is electrically connected to the grounding wiring 6. Furthermore, the bonding pad 4d is electrically connected to one of the source or the drain of the nMISFET Qn5 and the other of the source or the drain of the nMISFET Qn5 is electrically connected to the grounding wiring 6. The bonding pad 4d is electrically connected to one of the source or the drain of the nMISFET Qn6 and the other of the source or the drain of the nMISFET Qn6 is electrically connected to the grounding wiring 6.

As can be seen from FIG. 24, the input/output circuit 11c has protective n-channel MISFETs Qn7 and Qn8 (hereinafter referred to as "nMISFET Qn7" and "nMISFET Qn8") and protective diodes D7 and D8. The bonding pad 4e is electrically and directly connected to the grounding wiring 6 and electrically connected to the power supply wiring 5 through nMISFETs Qn7 and Qn8 and the diodes D7 and D8 acting as protective elements.

Specifically, the bonding pad 4e is electrically connected to the power supply wiring 5 through the diode element D7 and to the power supply wiring 5 through the diode element D8. In other words, the bonding pad 4e is electrically connected to one of the anode or the cathode of the diode D7 and the other of the anode or the cathode of the diode D7 is electrically connected to the power supply wiring 5. In addition, the bonding pad 4e is electrically connected to one of the anode or the cathode of the diode D8 and the other of the anode or the cathode of the diode D8 is electrically connected to the power supply wiring 5. Furthermore, the bonding pad 4e is electrically connected to one of the source or the drain of the nMISFET Qn7 and the other of the source or the drain of the nMISFET Qn7 is electrically connected to the power supply wiring 5. The bonding pad 4e is electrically connected to one of the source or the drain of the nMISFET Qn8 and the other of the source or the drain of the nMISFET Qn8 is electrically connected to the power supply wiring 5.

The nMISFETs Qn5, Qn6, Qn7 and Qn8 and the diodes D5, D6, D7 and D8 constituting the input/output circuits 11b and 11c are capable of functioning as elements for protection (protective element). When a surge (ESD surge) or the like, for example, is inputted into the bonding pads 4d, it can be passed to the grounding wiring 6 through the nMISFETs Qn5 and Qp6 and the diodes D5 and D6. When a surge (ESD surge) or the like, for example, is inputted into the bonding pads 4e, it can also be passed to the power supply wiring 5 through the nMISFETs Qn7 and Qp8 and the diodes D7 and D8. Thus, the input/output circuits 11b and 11c are capable of functioning as protective circuits for the core power-supplying cell and the core CND-supplying cell.

As shown in FIGS. 17 to 22, in the input/output circuit 11b, an nMISFET forming region 21b, a diode element forming region 23b, a pulling-out region 24, a diode element forming region 25b and an nMISFET forming region 27b are arranged at the periphery of the main surface 2 of the semiconductor device 1 in this order in the direction from the inside (the inner side of the main surface 2 of the semiconductor device 1) to the periphery (the side of the end 2a of main surface 2 of the semiconductor device 1), i.e., in the X-direction. The region for forming the input/output circuit 11c is also the same in configuration as that for forming the input/output circuit 11b. That is to say, in the input/output circuit 11c, an nMISFET forming region 21c, a diode element forming region 23c, a pulling-out region 24, a diode element forming region 25c and an nMISFET forming region 27c are arranged at the periphery of the main surface 2 of the semiconductor device 1 in this order in the direction from the inside (the inner side of the main surface 2 of the semiconductor device 1) to the periphery (the side of the end 2a of main surface 2 of the semiconductor device 1), i.e., in the X-direction.

The nMISFET forming region 21b is a region where an MISFET corresponding to the nMISFET Qn5 is formed and the diode element forming region 23b is a region where a diode element corresponding to the diode element D5 is formed. The diode element forming region 25b is a region where a diode element corresponding to the diode element D6 is formed. The nMISFET forming region 27b is a region where a MISFET corresponding to the nMISFET Qn6 is formed. Therefore, the input/output circuit 11b is formed by the nMISFET forming region 21b (nMISFET Qn5), the diode element forming region 23b (the diode element D5), the diode element forming region 25b (the diode element D6) and the nMISFET forming region 27b (nMISFET Qn6). The input/output circuit 11b is provided in the vicinity of the bonding pad 4d.

The nMISFET forming region 21c is a region where an MISFET corresponding to the nMISFET Qn7 is formed and the diode element forming region 23c is a region where a diode element corresponding to the diode element D7 is formed. The diode element forming region 25c is a region where a diode element corresponding to the diode element D8 is formed. The nMISFET forming region 27c is a region where a MISFET corresponding to the nMISFET Qn8 is formed. Therefore, the input/output circuit 11c is formed by the nMISFET forming region 21c (nMISFET Qn7), the diode element forming region 23c (the diode element D7), the diode element forming region 25c (the diode element D8) and the nMISFET forming region 27c (nMISFET Qn8). The input/output circuit 11c is provided in the vicinity of the bonding pad 4e.

The configuration of periphery of the semiconductor device (around the bonding pads 4d and 4e) according to the present embodiment is described in further detail with reference to FIGS. 17 to 22.

In the present embodiment, the regions for forming the input/output circuits 27b and 27c are adjacently arranged to each other in the Y-direction. The bonding pads 4d and 4e are also adjacently arranged to each other.

Each of the regions for forming the input/output circuits 27b and 27c is substantially the same in configuration as that for forming the input/output circuit 11a in the third embodiment except for wirings. That is to say, each of the nMISFET forming regions 21b and 21c is substantially the same in configuration as the above nMISFET forming region 21a except for wirings. Each of the diode element forming regions 23b and 23c is substantially the same in configuration as the above diode element forming region 23a except for wirings. Each of the diode element forming regions 25b and 25c is substantially the same in configuration as the above diode element forming region 25a except for wirings. Each of the pMISFET forming regions 27b and 27c is substantially the same in configuration as the above nMISFET forming region 27a except for wirings. For these reasons, description is omitted herein on the configuration of the nMISFET forming regions 21b, 21c, 27b and 27c and the diode element forming regions 23b, 23c, 25b and 25c.

FIG. 21 shows a cross section (in the X-direction) passing through the n-type semiconductor regions 62a in the nMISFET forming regions 21b and 27b and the n-type semiconductor regions 63 in the diode element forming regions 23b and 25b. In addition, FIG. 22 shows a cross section (in the X-direction) passing through the n-type semiconductor regions 62a in the nMISFET forming regions 21c and 27c and the p-type semiconductor region 64 in the diode element forming regions 23c and 25c.

Also, in the present embodiment, as is the case with the first to third embodiments, a multilayer wiring structure formed of a plurality of interlayer insulating films (integrally illustrated as the insulating film 50) and of wiring layers (wirings M1 to M7) is laid over the semiconductor substrate 30.

In the present embodiment, the grounding wiring 7 and the power supply wiring 8 are formed by the sixth and seventh layer wirings M6 and M7 and the plugs PG connecting between the wirings M6 and M7. Furthermore, the grounding wiring 7 and the power supply wiring 8 extend in the Y-direction along the periphery of the semiconductor device to pass through over the protective elements (the nMISFET forming regions 21b, 21c, 27b and 27c and the diode element forming regions 23b, 23c, 25b and 25c) constituting the input/output circuits 11b and 11c. Where, the grounding wiring 7 passes through over the nMISFET forming regions 21a and 21c and the diode element forming regions 23b and 23c. The power supply wiring 8 passes through over the diode element forming regions 25b and 25c and the nMISFET forming regions 27b and 27c.

In the present embodiment, furthermore, a wiring 71 including the fourth and fifth layer wirings M4 and M5 is provided under the grounding wiring 7. A wiring 72 including the fourth and fifth layer wirings M4 and M5 is provided under the power supply wiring 8. The wiring 71 extends over from the nMISFET forming region 21b and the diode element forming region 23b in the input/output circuit 11b to the nMISFET forming region 21c and the diode element forming region 23c in the input/output circuit 11c in the Y-direction. The wiring 72 extends over from the diode element forming region 25b and the nMISFET forming region 27b in the input/output circuit 11b to the diode element forming region 25c and the nMISFET forming region 27c in the input/output circuit 11c in the Y-direction.

The power supply wiring 5 and the grounding wiring 6 are formed by the fourth, fifth, sixth and seventh layer wirings M4, M5, M6 and M7 and the plugs PG connecting between the wirings M4, M5, M6 and M7. The power supply wiring 5 and the grounding wiring 6 extend in the Y-direction further inside than the grounding wiring 7 and the power supply wiring 8, i.e., further inside than the input/output circuits 11b and 11c.

The conductive layer 51 that is the uppermost metallic layer is exposed from the opening 52 of the protective film (illustrated as the insulating film 50) to form the bonding pads 4c and 4e, as is the case with the bonding pad 4 in the first embodiment. The bonding pad 4*d* is integrally formed with the conductive layer 51, and a part of the conductive layer 51 is the bonding pad 4*d*. In additions, the bonding pad 4*e* is integrally formed with the conductive layer 51, and a part of the conductive layer 51 is the bonding pad 4*e*. The conductive layer 51 for the bonding pad 4*d* and the conductive layer 51 for the bonding pad 4*e* are on the same layer, however, are differently patterned conductive layers separated from each other. The power supply wiring 51 may be regarded as a conductive layer positioned over the grounding wiring 7 and the power supply wiring 8 and electrically connected to the bonding pads 4*d* and 4*e*. In addition, the pattern of the conductive layer 51 may be used also for the eight layer wiring (uppermost layer wiring) to form the power supply wiring 5 and the grounding wiring 6 by the wirings M4, M5, M6 and M7 and the conductive layer 51.

The bonding pad 4*d* is arranged over the protective element (the nMISFET forming regions 21*b* and 27*b* and the diode element forming regions 23*b* and 25*b*) constituting the input/output circuit 11*b*. The bonding pad 4*e* is arranged over the protective element (the nMISFET forming regions 21*c* and 27*c* and the diode element forming regions 23*c* and 25*c*) constituting the input/output circuit 11*c*.

A plurality of the bonding pads 4 including the bonding pads 4*d* and 4*e* may be staggered. At this point, the bonding pads 4*d* and 4*e* are shifted in position in the Y-direction. One of the bonding pads 4*d* and 4*e* (where, the bonding pad 4*e*) is arranged on the side near the end of the semiconductor device as in the case of the first bonding pad 4*a*, and the other of the bonding pads 4*d* and 4*e* (where, the bonding pad 4*d*) is arranged further inside than the bonding pad 4*e* as in the case of the first bonding pad 4*b*.

For that reason, as illustrated in the figures, the bonding pad 4*d* is arranged over the nMISFET forming region 21*b* and the diode element forming region 23*b* and the bonding pad 4*e* is arranged over the diode element forming region 25*c* and the nMISFET forming region 27*c*. As another embodiment, the bonding pad 4*d* may be arranged over the diode element forming region 25*b* and the nMISFET forming region 27*b* and the bonding pad 4*e* may be arranged over the nMISFET forming region 21*c* and the diode element forming region 23*c*.

The conductive layer 51 for the bonding pad 4*d* extends from over the pulling-out region 24 to over the power supply wiring 5 while passing through over the diode element forming region 23*b* and the nMISFET forming region 21*b* and is electrically connected to the power supply wiring 5 under the conductive layer 51 through the plugs PG. The conductive layer 51 for the bonding pad 4*d* is electrically connected to the wiring 53*b* positioned under the conductive layer 51 through the pulling-out region 24. The wiring 53*b* is a wiring positioned under the power supply wiring 5, the grounding wiring 6, the grounding wiring 7, the power supply wiring 8, the conductive layer 51 and the wirings 71 and 72, and includes, for example, the first, second and third layer wirings M1, M2 and M3 and the plugs PG. As shown in FIG. 21, the wiring 53*b* extends from the region for forming the input/output circuit 11*b* to under the power supply wiring 5 and is electrically connected to the power supply wiring 5 positioned over the wiring 53*b* through the plugs PG and to the wiring 72 positioned over the wiring 53*b* through the plugs PG. The wiring 53*b* is further electrically connected to the n-type semiconductor regions 63 in the diode element forming regions 23*b* and 25*b* and the n-type semiconductor regions 62*a* in the nMISFET forming regions 21*b* and 27*b* under the wiring 53*b* through the plugs PG.

The conductive layer 51 for the bonding pad 4*e* extends from over the nMISFET forming region 27*c* to over the grounding wiring 6 while passing the diode element forming region 25*c*, the pulling-out region 24, the diode element forming region 23*c* and the nMISFET forming region 21*c* and is electrically connected to the power supply wiring 6 under the conductive layer 51 through the plugs PG. The conductive layer 51 for the bonding pad 4*e* is electrically connected to the wiring 53*c* positioned under the conductive layer 51 through the pulling-out region 24. The wiring 53*c* is a wiring positioned under the power supply wiring 5, the grounding wiring 6, the grounding wiring 7, the power supply wiring 8, the conductive layer 51 and the wirings 71 and 72, and includes, for example, the first, second and third layer wirings M1, M2 and M3 and the plugs PG. As shown in FIG. 22, the wiring 53*c* extends from the region for forming the input/output circuit 11*c* to under the grounding wiring 6 and is electrically connected to the power supply wiring 6 positioned over the wiring 53*c* through the plugs PG and to the wiring 71 positioned over the wiring 53*c* through the plugs PG. The wiring 53*c* is further electrically connected to the p-type semiconductor regions 64 in the diode element forming regions 23*c* and 25*c* and the n-type semiconductor regions 62*a* in the nMISFET forming regions 21*c* and 27*c* under the wiring 53*c* through the plugs PG.

The wirings 53*b* and 53*c* correspond to the wirings 53 and 53*a* in the first to third embodiments. Though an illustration is not provided here, as is the case with the third embodiment, the p-type semiconductor regions 64 in the diode element forming regions 23*b* and 25*b* and the n-type semiconductor regions 62*b* in the nMISFET forming regions 21*b* and 27*b* are electrically connected to a wiring through the plugs PG or the like, and the wiring is further electrically connected to the wiring 71 positioned further over the wiring through the plugs PG. Furthermore, though an illustration is not provided either, the n-type semiconductor regions 63 in the diode element forming regions 23*c* and 25*c* and the n-type semiconductor regions 62*b* in the nMISFET forming regions 21*c* and 27*c* are electrically connected to a wiring through the plugs PG, and the wiring is further electrically connected to the wiring 72 positioned further over the wiring through the plugs PG. The circuit configurations shown in FIGS. 23 and 24 are thus realized.

The wiring 53*b* is electrically connected to the protective elements (MISFET Qn5 and Qn6 in the nMISFET forming regions 21*b* and 27*b* and the diode elements D5 and D6 in the diode element forming regions 23*b* and 25*b*) formed on the semiconductor substrate 30 through the plugs PG. In addition, the wiring 53*c* is electrically connected to the protective elements (MISFETs Qn7 and Qn8 in the nMISFET forming regions 21*c* and 27*c* and the diode elements D7 and D8 in the diode element forming regions 23*c* and 25*c*) formed on the semiconductor substrate 30 through the plugs PG. The wirings 53*b* and 53*c* are positioned under the grounding wiring 7, the power supply wiring 8 and the wirings 71 and 72, and need to be electrically connected to the bonding pads 4*d* and 4*e* respectively. As is the case with the first embodiment, also in the present embodiment, the pulling-out region 24 is provided between the grounding wiring 7 and the power supply wiring 8, and the wirings 53*b* and 53*c* are pulled out over the grounding wiring 7 and the power supply wiring 8 to be connected to the conductive layer 51 in the pulling-out region 24.

In the present embodiment, the nMISFET that is a protective element constituting the input/output circuit 11*a* as a protective circuit is divided and formed into two nMISFET forming regions 21*b* and 27*b* and the diode element that is a protective element constituting the input/output circuit 11*a* is divided and formed into two diode element forming regions 23b and 25b. The pulling-out region 24 is arranged between a group including the nMISFET forming region 21b and the diode element forming region 23b and a group including the diode element forming region 25b and the nMISFET forming region 27b, and the wiring 53b is pulled out there over the wirings 71 and 72, the grounding wiring 7 and the power supply wiring 8 to be electrically connected to the conductive layer 51. In addition, the nMISFET that is a protective element constituting the input/output circuit 11c as a protective circuit is divided and formed into two nMISFET forming regions 21c and 27c and the diode element that is a protective element constituting the input/output circuit 11c is divided and formed into two diode element forming regions 23c and 25c. The pulling-out region 24 is arranged between a group including the nMISFET forming region 21c and the diode element forming region 23c and a group including the diode element forming region 25c and the nMISFET forming region 27c, and the wiring 53c is pulled out there over the wirings 71 and 72, the power supply wiring 5, the grounding wiring 6, the grounding wiring 7 and the power supply wiring 8 to be electrically connected to the conductive layer 51. It may be regarded that The pulling-out region 24 is arranged between the nMISFET forming regions 21b and 27b and that the pulling-out region 24 is arranged between the nMISFET forming regions 21c and 27c.

Such a configuration in the present embodiment enables providing substantially the same effect as the third embodiment.

Also in the present embodiment, as is the case with the first embodiment, for example, the pulling-out region 24 is provided between the grounding wiring 7 and the power supply wiring 8, and the wirings 53b and 53c are pulled out there over the wirings 71 and 72, the grounding wiring 7 and the power supply wiring 8 to be connected to the conductive layer 51, so that the bonding pads 4d and 4c can be arranged further inside, allowing the planar dimension of the semiconductor device (a semiconductor chip) to be reduced to downsize the semiconductor device.

In addition, each protective element (nMISFET and diode element) constituting the input/output circuits 11ba and 11c is divided into two regions to arrange the pulling-out region 24: between the nMISFET forming regions 21b and 27b and between the diode element forming regions 23b and 25b; and between the nMISFET forming regions 21c and 27c and between the diode element forming regions 23c and 25c. The wirings 53b and 53c are pulled out there to be connected to the conductive layer 51. Particularly, the nMISFET forming region occupying a larger area than the diode element forming regions 23b, 23c, 25b and 25c is divided into two regions, between which and the pulling-out region 24 is arranged. That is, in the input/output circuit 11b, the region for forming the nMISFET as a protective element is divided into the nMISFET forming regions 21b and 27b, between which the pulling-out region 24 is arranged. In the input/output circuit 11c, the region for forming the nMISFET as a protective element is divided into the nMISFET forming regions 21c and 27c, between which the pulling-out region 24 is arranged. This enables the pulling-out region 24 to be arranged around the center of the regions for forming the input/output circuits 11b and 11c, which permits the bonding pads 4d and 4c to be arranged at a position near the center of the regions for forming the input/output circuits 11b and 11c. For example, even when the bonding pad 4e is arranged outside the pulling-out region 24 (on the side of end of the semiconductor device 1), the bonding pad 4e can be arranged further inside by the position where the pulling-out region 24 is positioned further inside than the pMISFET forming region 27c, thereby allowing the planar dimension of the semiconductor device to be reduced to downsize the semiconductor device.

Furthermore, the present embodiment provides the following effect.

Since the bonding pad 4d is electrically connected to the power supply wiring 5, the bonding pad 4d is capable of supplying power supply electric potential (power supply voltage) to the power supply wiring 5. Since the wiring 72 is also connected to the conductive layer 51 for the bonding pad 4d through the wiring 53b and the pulling-out region 24, the wiring 72 is also electrically connected to the bonding pad 4d and the power supply wiring 5 to be supplied with power supply electric potential. In addition, since the bonding pad 4e is electrically connected to the grounding wiring 6, the bonding pad 4e is capable of supplying grounding electric potential (grounding voltage) to the grounding wiring 6. Since the wiring 71 is also connected to the conductive layer 51 for the bonding pad 4e through the wiring 53c and the pulling-out region 24, the wiring 71 is also electrically connected to the bonding pad 4e and the grounding wiring 6 to be supplied with grounding electric potential.

Since the wiring 71 extends from over the nMISFET forming region 21b and the diode element forming region 23b to over the nMISFET forming region 21c and the diode element forming region 23c, the p-type semiconductor region 64 in the diode element forming regions 23b and 25b and the n-type semiconductor region 62b in the nMISFET forming regions 21b and 27b can be connected to the wiring 71 (the wiring 71 electrically connected to the grounding wiring 6) extending thereover. In addition, since the wiring 72 extends from over the diode element forming region 25b and the nMISFET forming region 27b to over the diode element forming region 25c and the nMISFET forming region 27c, the n-type semiconductor region 63 in the diode element forming regions 23c and 25c and the n-type semiconductor region 62b in the nMISFET forming regions 21c and 27c can be connected to the wiring 72 (the wiring 72 electrically connected to the power supply wiring 5) extending thereover.

Thus providing the wirings 71 and 72 enables simplifying routing the wirings for connecting the diodes D5 and D6 and the nMISFETs Qn5 and Qn6 to the grounding wiring 6 and for connecting the diodes D7 and D8 and the nMISFETs Qn7 and Qn8 to the power supply wiring 5. In addition, the wiring for connecting the diodes D5 and D6 and the nMISFETs Qn5 and Qn6 to the grounding wiring 6 can be substantially equalized in length with the wiring for connecting the diodes D7 and D8 and the nMISFETs Qn7 and Qn8 to the power supply wiring 5, which allows the performances of the semiconductor device to be further improved.

Although the invention made by the present inventors has been described in detail referring to the embodiments, the invention is no way limited only to the foregoing embodiments but can be varied within a scope not departing from the gist thereof.

The present invention is suitable to be applied to a semiconductor device with bonding pads.

What is claimed is:

1. A semiconductor device comprising:
a semiconductor substrate having a main surface which has an edge;
a plurality of output circuits disposed in a row along the edge on the main surface;
each of the plurality of output circuits including a first MISFET and a second MISFET, wherein a shortest distance between the first MISFET and the edge of the main surface is smaller than that between the second MISFET and the edge of the main surface;

a first bonding pad disposed over the main surface, the first bonding pad being overlapped with the first MISFET in a first output circuit of the plurality of output circuits in plan view;

a first wiring disposed under the first bonding pad, the first bonding pad being overlapped with the first wiring in plan view;

a first conductor plug disposed between the first bonding pad and the first wiring, the first conductor plug connecting the first bonding pad and the first wiring, the first bonding pad and the first wiring being electrically connected to the first and second MISFETs in the first output circuit;

a second bonding pad disposed over the main surface, the second bonding pad being overlapped with the second MISFET in a second output circuit of the plurality of output circuits in plan view, the first output circuit and the second output circuit being disposed side by side;

a second wiring disposed under the second bonding pad, the second bonding pad and the second wiring being overlapped in plan view; and a second conductor plug disposed between the second bonding pad and the second wiring, the second conductor plug connecting the second bonding pad and the second wiring, the second bonding pad and the second wiring being electrically connected to the first and second MISFETs in the second output circuit, wherein a shortest distance between the first bonding pad and the edge of the main surface is smaller than that between the second bonding pad and the edge of the main surface, wherein the first wiring is located between the first MISFET and the second MISFET in the first output circuit in plan view, wherein the second wiring is located between the first MISFET and the second MISFET in the second output circuit in plan view, wherein the first conductor plug is located between the first MISFET and the second MISFET in the first output circuit in plan view, and wherein the second conductor plug is located between the first MISFET and the second MISFET in the second output circuit in plan view.

2. A semiconductor device according to claim 1, wherein the first MISFET in the first output circuit and the first MISFET in the second output circuit are located side by side, and the second MISFET in the first output circuit and the second MISFET in the second output circuit are located side by side.

3. A semiconductor device according to claim 1, wherein the first and second bonding pads form a staggered bonding pad arrangement.

4. A semiconductor device according to claim 1, wherein each of the plurality of output circuits includes a first protection diode and a second protection diode, the first and second protection diodes in the first output circuit are electrically connected to the first bonding pad, the first and second protection diodes in the second output circuit are electrically connected to the second bonding pad, the first conductor plug is located between the first and second protection diodes in the first output circuit in plan view, and the second conductor plug is located between the first and second protection diodes in the second output circuit in plan view.

5. A semiconductor device according to claim 1, wherein a protective film is disposed over the first and second bonding pads, and the first and second bonding pads are partially exposed from the protective film.

6. A semiconductor device according to claim 5, wherein the protective film is overlapped with the first and second conductive plugs in plan view.

7. A semiconductor device according to claim 1, wherein the first and second MISFETs are a pMISFET and an nMISFET, respectively.

8. A semiconductor device according to claim 1, wherein the first and second bonding pads are comprised of aluminum, and the first and second wirings are comprised of copper.

9. A semiconductor device having staggered bonding pads, comprising:

a semiconductor substrate having a main surface which has an edge;

a plurality of first output circuits and a plurality of second output circuits disposed in a row along the edge on the main surface, each of the plurality of first output circuits and each of the plurality of second output circuits being disposed side by side, each of the plurality of first and second output circuits including a first MISFET and a second MISFET, wherein a shortest distance between the first MISFET and the edge of the main surface is smaller than that between the second MISFET and the edge of the main surface;

a plurality of first bonding pads of the staggered bonding pads disposed over the main surface, the plurality of first bonding pads being disposed in a row along the edge of the main surface, each of the plurality of first bonding pads being overlapped with the first MISFET of each of the plurality of first output circuits in plan view;

a plurality of second bonding pads of the staggered bonding pads disposed over the main surface, the plurality of second bonding pads being disposed in a row along the edge of the main surface, a shortest distance between the plurality of first bonding pads and the edge of the main surface being smaller than that between the plurality of second bonding pads and the edge of the main surface, each of the plurality of second bonding pads being overlapped with the second MISFET of each of the plurality of second output circuits in plan view;

a first wiring disposed under each of the plurality of first bonding pads, each of the first bonding pads being overlapped with the first wiring in plan view;

a first conductor plug disposed between each of the plurality of first bonding pads and the first wiring, the first conductor plug connecting each of the plurality of first bonding pads and the first wiring, each of the plurality of first bonding pads and the first wiring being electrically connected to the first and second MISFETs in each of the plurality of first output circuits;

a second wiring disposed under each of the plurality of second bonding pads, each of the second bonding pads being overlapped with the second wiring in plan view;

a second conductor plug disposed between each of the plurality of second bonding pads and the second wiring, the second conductor plug connecting each of the plurality of second bonding pads and the second wiring, each of the plurality of second bonding pads and the second wiring being electrically connected to the first and second MISFETs in each of the plurality of second output circuits;

wherein the first wiring is located between the first MISFET and the second MISFET in each of the plurality of first output circuits in plan view, wherein the second wiring is located between the first MISFET and the second MISFET in each of the plurality of second output circuits in plan view, wherein the first conductor plug is located between the first MISFET and the second MISFET in each of the plurality of first output circuits in plan view, and wherein the second conductor plug is located between the first MISFET and the second MISFET in each of the plurality of second output circuits in plan view.

10. A semiconductor device according to claim 9, wherein the first MISFET in the first output circuit and the first MISFET in the second output circuit are located side by side, and the second MISFET in the first output circuit and the second MISFET in the second output circuit are located side by side.

11. A semiconductor device according to claim 9, wherein each of the plurality of output circuits includes a first protection diode and a second protection diode, the first and second protection diodes in the first output circuit are electrically connected to the first bonding pad, the first and second protection diodes in the second output circuit are electrically connected to the second bonding pad, the first conductor plug is located between the first and second protection diodes in the first output circuit in plan view, and the second conductor plug is located between the first and second protection diodes in the second output circuit in plan view.

12. A semiconductor device according to claim 9, wherein a protective film is disposed over the first and second bonding pads, and the first and second bonding pads are partially exposed from the protective film.

13. A semiconductor device according to claim 12, wherein the protective film is overlapped with the first and second conductive plugs in plan view.

14. A semiconductor device according to claim 9, wherein the first and second MISFETs are a pMISFET and an nMISFET, respectively.

15. A semiconductor device according to claim 9, wherein the first and second bonding pads are comprised of aluminum, and the first and second wirings are comprised of copper.

* * * * *